US012308958B2

(12) United States Patent
Sen et al.

(10) Patent No.: US 12,308,958 B2
(45) Date of Patent: May 20, 2025

(54) FAST CONVERGING LOW-DENSITY PARITY-CHECK TECHNIQUES

(71) Applicant: QUALCOMM Incorporated, San Diego, CA (US)

(72) Inventors: Pinar Sen, San Diego, CA (US); Wei Yang, San Diego, CA (US); Jing Jiang, San Diego, CA (US); Gabi Sarkis, San Diego, CA (US); Thomas Joseph Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 106 days.

(21) Appl. No.: 18/450,280

(22) Filed: Aug. 15, 2023

(65) Prior Publication Data

US 2025/0062857 A1 Feb. 20, 2025

(51) Int. Cl.
*H04L 1/00* (2006.01)
*H03M 13/00* (2006.01)
*H03M 13/11* (2006.01)

(52) U.S. Cl.
CPC ....... *H04L 1/0041* (2013.01); *H03M 13/1102* (2013.01); *H03M 13/116* (2013.01); *H03M 13/6362* (2013.01); *H03M 13/6368* (2013.01)

(58) Field of Classification Search
CPC ............ H04L 1/0041; H03M 13/1102; H03M 13/6362; H03M 13/6368; H03M 13/116

(Continued)

(56) References Cited

U.S. PATENT DOCUMENTS 10,291,354 B2  5/2019  Richardson et al.
10,735,134 B2* 8/2020  Soriaga ............ H03M 13/6393
(Continued)

FOREIGN PATENT DOCUMENTS

WO   WO-2017218665      12/2017
WO   WO-2019191398 A1  10/2019

OTHER PUBLICATIONS

Xie et al., Design of Rate-compatible Protograph-based LDPC Codes with Mixed Circulants, 2010, IEEE, pp. 434-438. (Year: 2010).*

(Continued)

*Primary Examiner* — John J Tabone, Jr.
(74) *Attorney, Agent, or Firm* — Guang Y. Zhang; Holland & Hart LLP

(57) ABSTRACT

Methods, systems, and devices for wireless communications are described. A transmitting device may perform a lifting procedure on a base graph including multiple variable nodes and multiple check nodes to obtain a lifted graph. The lifting procedure may include replacing each edge between multiple variable nodes and multiple check nodes of the base graph with a respective identity matrices with respective circular shift values. The base graph may include a punctured variable node which corresponds to each of one or more check nodes of the plurality of check nodes via multiple edges. The transmitting device may encode multiple information nodes and multiple parity nodes according to the lifted graph. The transmitting device may transmit a signal including multiple information bits and multiple parity bits based on encoding the multiple information nodes and the multiple parity nodes.

30 Claims, 15 Drawing Sheets

(58) Field of Classification Search
USPC .................................... 714/821, 751, 799
See application file for complete search history.

(56) References Cited

U.S. PATENT DOCUMENTS

| | | | |
|---|---|---|---|
| 12,191,884 B2* | 1/2025 | Richardson | H03M 13/616 |
| 2013/0139024 A1 | 5/2013 | Nguyen et al. | |
| 2014/0229788 A1* | 8/2014 | Richardson | H03M 13/1188 |
| | | | 714/752 |
| 2014/0229789 A1* | 8/2014 | Richardson | H03M 13/036 |
| | | | 714/752 |
| 2016/0218750 A1* | 7/2016 | Ma | H03M 13/611 |
| 2017/0359148 A1* | 12/2017 | Richardson | H04L 1/0068 |
| 2019/0052400 A1* | 2/2019 | Soriaga | H03M 13/6393 |
| 2019/0207710 A1* | 7/2019 | Ye | H03M 13/6306 |
| 2022/0224356 A1* | 7/2022 | Kudekar | H03M 13/6393 |
| 2023/0327683 A1* | 10/2023 | Kudekar | H03M 13/116 |
| | | | 714/776 |
| 2024/0322840 A1* | 9/2024 | Richardson | H03M 13/1174 |

OTHER PUBLICATIONS

Chen Z., et al., "Application of Protograph-based LDPC Codes in Underwater Acoustic Channels", Proc, IEEE International Conference on Signal Processing, Communications and Computing, ICSPCC 2014, Aug. 5, 2014, XP032708890, ISBN: 978-1-4799-5272-4, pp. 923-927.
International Search Report and Written Opinion—PCT/US2024/038960—ISA/EPO—Oct. 18, 2024.

* cited by examiner

FAST CONVERGING LOW-DENSITY PARITY-CHECK TECHNIQUES

FIELD OF TECHNOLOGY

The following relates to wireless communications, including fast converging low-density parity-check (LDPC) techniques.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The described techniques relate to improved methods, systems, devices, and apparatuses that support fast converging low-density parity-check (LDPC) techniques. For example, the described techniques provide for LDPC coding using a base graph with a single punctured node that has one or more double-edge elements. A transmitting device may generate an LDPC code according to the base graph with the single punctured node, such as a single punctured variable node. The single punctured node may have double-edged elements corresponding to two edges with a check node. The transmitting device may perform a lifting procedure on the base graph with a single punctured node that has multi-edge elements. In some examples, the transmitting device may use lifting sizes which are larger than a threshold size. Additionally, or alternatively, the transmitting device may remove one or more edges of the base graph when using a small lifting size, which may prevent short cycles of the lifted graph. In some systems, for each lifting size, lifting values may be stored in a matrix. For the punctured node with multi-edge elements, the transmitting device may use a corresponding quantity of lifting values for the multi-edge elements. For example, for a double edge element, the transmitting device may have two separate lifting values for each edge of the double edge element. The double edge element may be replaced by a summation of two separate circularly shifted identity matrices. Techniques for storing the lifting values are described herein.

A method for wireless communications by a transmitting device is described. The method may include performing a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges, encoding a set of multiple information nodes and a set of multiple parity nodes according to the lifted graph, and transmitting a signal including a set of multiple information bits and a set of multiple parity bits based on encoding the set of multiple information nodes and the set of multiple parity nodes.

A transmitting device for wireless communications is described. The transmitting device may include one or more memories storing processor executable code, and one or more processors coupled with the one or more memories. The one or more processors may individually or collectively operable to execute the code to cause the transmitting device to perform a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges, encode a set of multiple information nodes and a set of multiple parity nodes according to the lifted graph, and transmit a signal including a set of multiple information bits and a set of multiple parity bits based on encoding the set of multiple information nodes and the set of multiple parity nodes.

Another transmitting device for wireless communications is described. The transmitting device may include means for performing a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges, means for encoding a set of multiple information nodes and a set of multiple parity nodes according to the lifted graph, and means for transmitting a signal including a set of multiple information bits and a set of multiple parity bits based on encoding the set of multiple information nodes and the set of multiple parity nodes.

A non-transitory computer-readable medium storing code for wireless communications is described. The code may include instructions executable by a processor to perform a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges, encode a set of multiple information nodes and a set of multiple parity nodes according to the lifted graph, and transmit a signal including a set of multiple information bits and a set of multiple parity bits based on encoding the set of multiple information nodes and the set of multiple parity nodes.

Some examples of the method, transmitting devices, and non-transitory computer-readable medium described herein may further include operations, features, means, or instructions for selecting a size for the lifted graph based on a quantity of coded bits satisfying a threshold quantity of bits.

Some examples of the method, transmitting devices, and non-transitory computer-readable medium described herein may further include operations, features, means, or instructions for removing one or more edges from the set of multiple edges based on a quantity of coded bits satisfying a threshold quantity of bits, where replacing each edge between the set of multiple variable nodes and the set of multiple check nodes may be based on removing the one or more edges from the set of multiple edges.

In some examples of the method, transmitting devices, and non-transitory computer-readable medium described herein, the base graph includes a single punctured node and the punctured variable node may be the single punctured node.

In some examples of the method, transmitting devices, and non-transitory computer-readable medium described herein, encoding the set of multiple information nodes and the set of multiple parity nodes may include operations, features, means, or instructions for replacing the set of multiple edges between the punctured variable node and the one or more check nodes with a summation of a respective set of multiple identity matrices with respective circular shift values.

In some examples of the method, transmitting devices, and non-transitory computer-readable medium described herein, a size of the lifted graph may be based on a codeblock length and a length of the base graph.

In some examples of the method, transmitting devices, and non-transitory computer-readable medium described herein, performing the lifting procedure may include operations, features, means, or instructions for generating multiple copies of the base graph that may be connected via edge permutation based on replacing each edge between the set of multiple variable nodes and the set of multiple check nodes with the respective set of multiple identity matrices with the respective circular shift values.

In some examples of the method, transmitting devices, and non-transitory computer-readable medium described herein, performing the lifting procedure may include operations, features, means, or instructions for determining, from a table, the respective circular shift values of the respective set of multiple identity matrices for each edge of the base graph.

In some examples of the method, transmitting devices, and non-transitory computer-readable medium described herein, the table includes a set of multiple circular shift values for each identity matrix applied to the set of multiple edges associated with the punctured variable node.

In some examples of the method, transmitting devices, and non-transitory computer-readable medium described herein, the table includes a singular value indicative of a set of multiple circular shift values for each identity matrix applied to the set of multiple edges associated with the punctured variable node based on a size of the lifted graph.

In some examples of the method, transmitting devices, and non-transitory computer-readable medium described herein, encoding the set of multiple information nodes and the set of multiple parity nodes may include operations, features, means, or instructions for encoding the set of multiple information nodes and the set of multiple parity nodes in accordance with a second degree encoding chain and a first degree hybrid automatic repeat request (HARQ) extension.

In some examples of the method, transmitting devices, and non-transitory computer-readable medium described herein, a core portion of the base graph includes a higher density of double edges to check nodes than an extension portion of the base graph.

In some examples of the method, transmitting devices, and non-transitory computer-readable medium described herein, the extension portion of the base graph includes a higher density of single edges to check nodes than the core portion of the base graph.

A method for wireless communications by a receiving device is described. The method may include receiving a signal including a set of multiple information bits and a set of multiple parity bits corresponding to an LDPC code, generate the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges, and decode the set of multiple information bits based on the set of multiple parity bits, a set of multiple information nodes, and a set of multiple parity nodes, the set of multiple information nodes and the set of multiple parity nodes corresponding to the base graph.

A receiving device for wireless communications is described. The receiving device may include one or more memories storing processor executable code, and one or more processors coupled with the one or more memories. The one or more processors may individually or collectively operable to execute the code to cause the receiving device to receive a signal including a set of multiple information bits and a set of multiple parity bits corresponding to an LDPC code, generate the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges, and decode the set of multiple information bits based on the set of multiple parity bits, a set of multiple information nodes, and a set of multiple parity nodes, the set of multiple information nodes and the set of multiple parity nodes corresponding to the base graph.

Another receiving device for wireless communications is described. The receiving device may include means for receiving a signal including a set of multiple information bits and a set of multiple parity bits corresponding to an LDPC code, means for generate the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges, and means for decode the set of multiple information bits based on the set of multiple parity bits, a set of multiple information nodes, and a set of multiple parity nodes, the set of multiple information nodes and the set of multiple parity nodes corresponding to the base graph.

A non-transitory computer-readable medium storing code for wireless communications is described. The code may include instructions executable by a processor to receive a signal including a set of multiple information bits and a set of multiple parity bits corresponding to an LDPC code, generate the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges, and decode the set of multiple information bits based on the set of multiple parity bits, a set of multiple information nodes, and a set of multiple parity nodes, the set of multiple information nodes and the set of multiple parity nodes corresponding to the base graph.

In some examples of the method, receiving devices, and non-transitory computer-readable medium described herein, decoding the set of multiple information bits may include operations, features, means, or instructions for decoding a first set of information bits associated with a first set of information nodes of the set of multiple information nodes based on the first set of information nodes having a single edge and a first degree of edges and decoding, after the first set of information bits, a second set of information bits associated with a second set of information nodes of the set of multiple information nodes having a single edge and a second degree of edges that may be greater than the first degree of edges.

In some examples of the method, receiving devices, and non-transitory computer-readable medium described herein, decoding the set of multiple information bits may include operations, features, means, or instructions for decoding a first set of information bits associated with a first check node that may be connected to the punctured variable node via a single edge and decoding, after the first set of information bits, a second set of information bits associated with a second check node of the one or more check nodes that may be connected to the punctured variable node via the set of multiple edges.

Some examples of the method, receiving devices, and non-transitory computer-readable medium described herein may further include operations, features, means, or instructions for identifying the base graph based on a quantity of coded bits satisfying a threshold quantity of bits.

Some examples of the method, receiving devices, and non-transitory computer-readable medium described herein may further include operations, features, means, or instructions for identifying one or more edges may be removed from the set of multiple edges based on a quantity of coded bits satisfying a threshold quantity of bits, where decoding the set of multiple information bits may be based on the one or more edges being removed from the set of multiple edges.

In some examples of the method, receiving devices, and non-transitory computer-readable medium described herein, the base graph includes a single punctured node and the punctured variable node may be the single punctured node.

In some examples of the method, receiving devices, and non-transitory computer-readable medium described herein, the multiple connected copies of the base graph may be connected via edge permutation based on each edge between the set of multiple variable nodes and the set of multiple check nodes being replaced with a respective set of multiple identity matrices with respective circular shift values.

In some examples of the method, receiving devices, and non-transitory computer-readable medium described herein, a core portion of the base graph includes a higher density of double edges to check nodes than an extension portion of the base graph.

In some examples of the method, receiving devices, and non-transitory computer-readable medium described herein, the extension portion of the base graph includes a higher density of single edges to check nodes than the core portion of the base graph.

DETAILED DESCRIPTION

Figure 1:
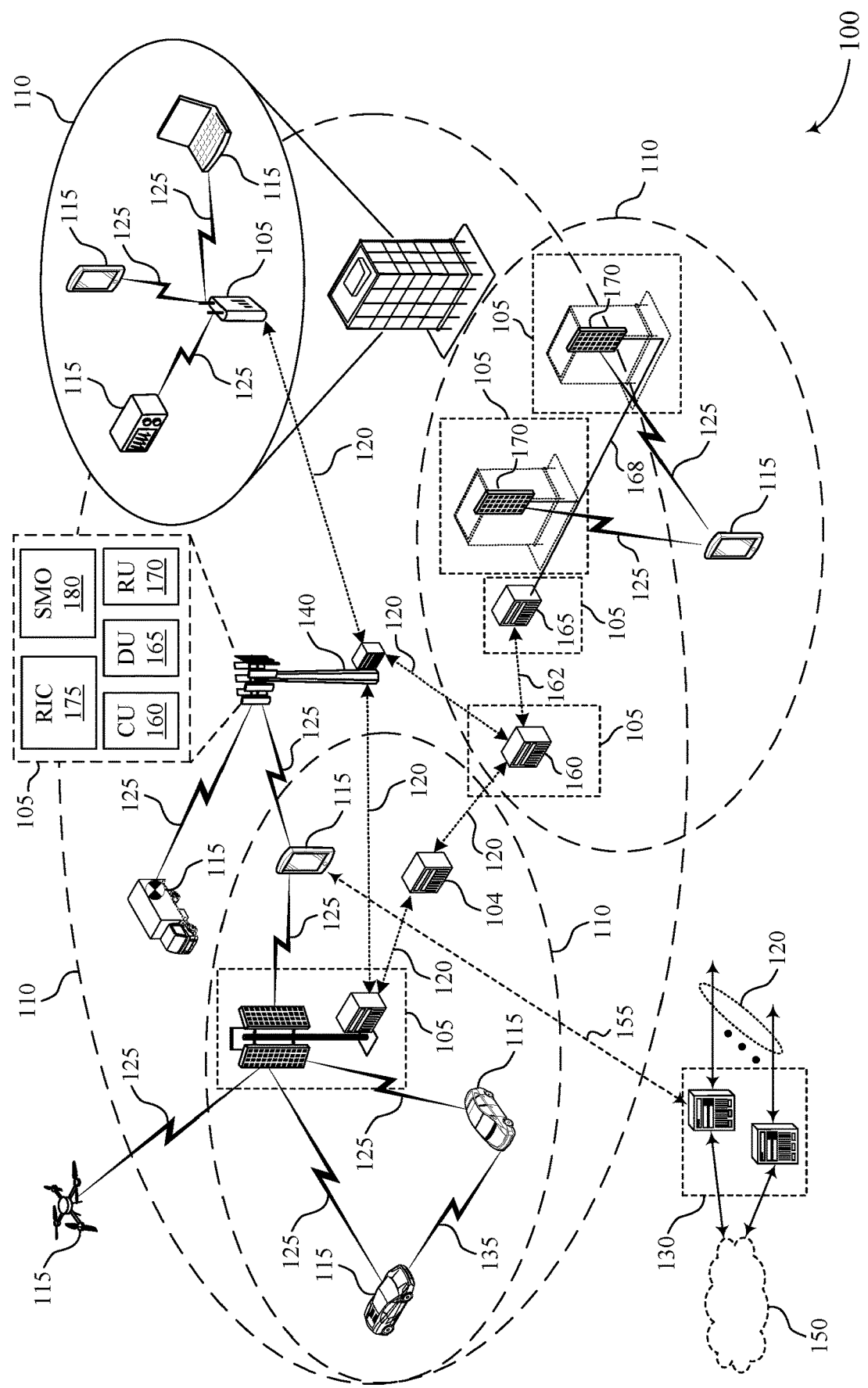
FIG. 1 shows an example of a wireless communications system that supports fast converging low-density parity-check (LDPC) techniques in accordance with one or more aspects of the present disclosure.

Some wireless communications systems may implement error correcting codes to transmit signals over noisy communications channels, such as low-density parity-check (LDPC) codes. LDPC codes may be defined by a base graph and a lifting operation performed on the base graph using a circulant identity matrix to create a quantity of copies of the base graph. The base graph may be defined by variable nodes (e.g., columns) and check nodes (rows). Entries of the base graph may correspond to edges between the variable nodes and the check nodes. For example, if an entry of the base graph between a first variable node and a first check node has a value of one, there may be an edge between the first variable node and the first check node. A degree of a variable node may correspond to a total quantity of edges for the variable node. Devices within the wireless communications systems may implement modulation operations, such as lower-order modulation operations (quadrature phase-shift keying (QPSK) modulation) and higher-order modulation operations (e.g., quadrature amplitude modulation (QAM) modulation) to map the multiple information bits to a modulation constellation. The base graph may be a small graph that corresponds to macroscopic properties of the code and may, in some examples, be referred to as a protograph. The lifting procedure may correspond to lifting, or replacing, each entry of the base graph with a circulant identity matrix, or an identity matrix which has been cyclically shifted. For example, the lifting procedure may copy the base graph multiple times (e.g., corresponding to a size of the identity matrices) and connecting the different copies of the base graph via edge permutation. In some systems, a base graph may be designed for asymptotic performance. Base graphs in some systems may include two punctured nodes (e.g., two punctured variable nodes), as a large degree of punctured nodes may correspond to improved asymptotic performance. However, having two punctured nodes may slow down convergence for high throughput applications. For punctured nodes to achieve a threshold reliability, a device may perform a large quantity of iterations.

Various aspects of the present disclosure are related to LDPC coding techniques. More specifically, aspects of the present disclosure are related to LDPC coding techniques using a base graph with a single punctured node that has one or more double-edge elements. A transmitting device may generate an LDPC code according to the base graph with the single punctured node, such as a single punctured variable node. The single punctured node may have double-edged elements corresponding to two edges with a check node. The single punctured node may provide faster convergence, as the increased reliability of using a single punctured node may improve faster through iterations compared to a base graph with two punctured nodes. The punctured node having double-edge elements may improve asymptotic performance by increasing a total degree of the punctured node by support multiple edges to a same check node. The transmitting device may perform a lifting procedure on the base graph with a single punctured node that has multi-edge elements. In some examples, the transmitting device may use lifting sizes (e.g., Z values) which are larger than a threshold size. Additionally, or alternatively, the transmitting device may remove one or more edges of the base graph when using a small lifting size to prevent short cycles of the lifted graph. In some systems, for each lifting size, lifting values may be stored in a matrix. For the punctured node with multi-edge elements, the transmitting device may use a corresponding quantity of lifting values for the multi-edge elements. For example, for a double edge element, the transmitting device may use two separate lifting values for each edge of the double edge element. Techniques for storing the lifting values are described herein.

Aspects of the disclosure are initially described in the context of wireless communications systems. Aspects of the disclosure are further illustrated by and described with reference to apparatus diagrams, system diagrams, and flowcharts that relate to fast converging LDPC techniques.

FIG. 1 shows an example of a wireless communications system 100 that supports fast converging LDPC techniques in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another via a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 via a communication link 155.

One or more of the network entities 105 described herein may include or may be referred to as a base station 140 (e.g., a base transceiver station, a radio base station, an NR base station, an access point, a radio transceiver, a NodeB, an eNodeB (cNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c. F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication via such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

For instance, an access network (AN) or RAN may include communications between access nodes (e.g., an IAB donor), IAB nodes 104, and one or more UEs 115. The IAB donor may facilitate connection between the core network 130 and the AN (e.g., via a wired or wireless connection to the core network 130). That is, an IAB donor may refer to a RAN node with a wired or wireless connection to core network 130. The IAB donor may include a CU 160 and at least one DU 165 (e.g., and RU 170), in which case the CU 160 may communicate with the core network 130 via an interface (e.g., a backhaul link). IAB donor and IAB nodes 104 may communicate via an F1 interface according to a protocol that defines signaling messages (e.g., an F1 AP protocol). Additionally, or alternatively, the CU 160 may communicate with the core network via an interface, which may be an example of a portion of backhaul link, and may communicate with other CUs 160 (e.g., a CU 160 associated with an alternative IAB donor) via an Xn-C interface, which may be an example of a portion of a backhaul link.

An IAB node 104 may refer to a RAN node that provides IAB functionality (e.g., access for UEs 115, wireless self-backhauling capabilities). A DU 165 may act as a distributed scheduling node towards child nodes associated with the IAB node 104, and the IAB-MT may act as a scheduled node towards parent nodes associated with the IAB node 104. That is, an IAB donor may be referred to as a parent node in communication with one or more child nodes (e.g., an IAB donor may relay transmissions for UEs through one or more other IAB nodes 104). Additionally, or alternatively, an IAB node 104 may also be referred to as a parent node or a child node to other IAB nodes 104, depending on the relay chain or configuration of the AN. Therefore, the IAB-MT entity of IAB nodes 104 may provide a Uu interface for a child IAB node 104 to receive signaling from a parent IAB node 104, and the DU interface (e.g., DUs 165) may provide a Uu interface for a parent IAB node 104 to signal to a child IAB node 104 or UE 115.

For example, IAB node 104 may be referred to as a parent node that supports communications for a child IAB node, or referred to as a child IAB node associated with an IAB donor, or both. The IAB donor may include a CU 160 with a wired or wireless connection (e.g., a backhaul communication link 120) to the core network 130 and may act as parent node to IAB nodes 104. For example, the DU 165 of IAB donor may relay transmissions to UEs 115 through IAB nodes 104, or may directly signal transmissions to a UE 115, or both. The CU 160 of IAB donor may signal communication link establishment via an F1 interface to IAB nodes 104, and the IAB nodes 104 may schedule transmissions (e.g., transmissions to the UEs 115 relayed from the IAB donor) through the DUs 165. That is, data may be relayed to and from IAB nodes 104 via signaling via an NR Uu interface to MT of the IAB node 104. Communications with IAB node 104 may be scheduled by a DU 165 of IAB donor and communications with IAB node 104 may be scheduled by DU 165 of IAB node 104.

In the case of the techniques described herein applied in the context of a disaggregated RAN architecture, one or more components of the disaggregated RAN architecture may be configured to support fast converging LDPC techniques as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) using resources associated with one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

In some examples, such as in a carrier aggregation configuration, a carrier may also have acquisition signaling or control signaling that coordinates operations for other carriers. A carrier may be associated with a frequency channel (e.g., an evolved universal mobile telecommunication system terrestrial radio access (E-UTRA) absolute RF channel number (EARFCN)) and may be identified according to a channel raster for discovery by the UEs 115. A carrier may be operated in a standalone mode, in which case initial acquisition and connection may be conducted by the UEs 115 via the carrier, or the carrier may be operated in a non-standalone mode, in which case a connection is anchored using a different carrier (e.g., of the same or a different radio access technology).

The communication links 125 shown in the wireless communications system 100 may include downlink transmissions (e.g., forward link transmissions) from a network entity 105 to a UE 115, uplink transmissions (e.g., return link transmissions) from a UE 115 to a network entity 105, or both, among other configurations of transmissions. Carriers may carry downlink or uplink communications (e.g., in an FDD mode) or may be configured to carry downlink and uplink communications (e.g., in a TDD mode).

A carrier may be associated with a particular bandwidth of the RF spectrum and, in some examples, the carrier bandwidth may be referred to as a "system bandwidth" of the carrier or the wireless communications system 100. For example, the carrier bandwidth may be one of a set of bandwidths for carriers of a particular radio access technology (e.g., 1.4, 3, 5, 10, 15, 20, 40, or 80 megahertz (MHz)). Devices of the wireless communications system 100 (e.g., the network entities 105, the UEs 115, or both) may have hardware configurations that support communications using a particular carrier bandwidth or may be configurable to support communications using one of a set of carrier bandwidths. In some examples, the wireless communications system 100 may include network entities 105 or UEs 115 that support concurrent communications using carriers associated with multiple carrier bandwidths. In some examples, each served UE 115 may be configured for operating using portions (e.g., a sub-band, a BWP) or all of a carrier bandwidth.

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

One or more numerologies for a carrier may be supported, and a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the network entities 105 or the UEs 115 may be expressed in multiples of a basic time unit which may, for example, refer to a sampling period of $T_s = 1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (STTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

A network entity 105 may provide communication coverage via one or more cells, for example a macro cell, a small cell, a hot spot, or other types of cells, or any combination thereof. The term "cell" may refer to a logical communication entity used for communication with a network entity 105 (e.g., using a carrier) and may be associated with an identifier for distinguishing neighboring cells (e.g., a physical cell identifier (PCID), a virtual cell identifier (VCID), or others). In some examples, a cell also may refer to a coverage area 110 or a portion of a coverage area 110 (e.g., a sector) over which the logical communication entity operates. Such cells may range from smaller areas (e.g., a structure, a subset of structure) to larger areas depending on various factors such as the capabilities of the network entity 105. For example, a cell may be or include a building, a subset of a building, or exterior spaces between or overlapping with coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered network entity 105 (e.g., a lower-powered base station 140), as compared with a macro cell, and a small cell may operate using the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A network entity 105 may support one or multiple cells and may also support communications via the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may support synchronous or asynchronous operation. For synchronous operation, network entities 105 (e.g., base stations 140) may have similar frame timings, and transmissions from different network entities 105 may be approximately aligned in time. For asynchronous operation, network entities 105 may have different frame timings, and transmissions from different network entities 105 may, in some examples, not be aligned in time. The techniques described herein may be used for either synchronous or asynchronous operations.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a network entity 105 (e.g., a base station 140) without human intervention. In some examples, M2M communication or MTC may include communications from devices that integrate sensors or meters to measure or capture information and relay such information to a central server or application program that uses the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception concurrently). In some examples, half-duplex communications may be performed at a reduced peak rate. Other power conservation techniques for the UEs 115 include entering a power saving deep sleep mode when not engaging in active communications, operating using a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs 115 via a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without an involvement of a network entity 105.

In some systems, a D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., network entities 105, base stations 140, RUs 170) using vehicle-to-network (V2N) communications, or with both.

The core network 130 may provide user authentication, access authorization, tracking. Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than 100 kilometers) compared to communications using the smaller frequencies and longer waves of the high frequency (HF) or very high frequency (VHF) portion of the spectrum below 300 MHz.

The wireless communications system 100 may also operate using a super high frequency (SHF) region, which may be in the range of 3 GHz to 30 GHz, also known as the centimeter band, or using an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the network entities 105 (e.g., base stations 140, RUs 170), and EHF antennas of the respective devices may be smaller and more closely spaced than UHF antennas. In some examples, such techniques may facilitate using antenna arrays within a device. The propagation of EHF transmissions, however, may be subject to even greater attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (e.g., the same codeword) or different data streams (e.g., different codewords). Different spatial layers may be associated with different antenna ports used for channel measurement and reporting. MIMO techniques include single-user MIMO (SU-MIMO), for which multiple spatial layers are transmitted to the same receiving device, and multiple-user MIMO (MU-MIMO), for which multiple spatial layers are transmitted to multiple devices.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A network entity 105 or a UE 115 may use beam sweeping techniques as part of beamforming operations. For example, a network entity 105 (e.g., a base station 140, an RU 170) may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a network entity 105 multiple times along different directions. For example, the network entity 105 may transmit a signal according to different beamforming weight sets associated with different directions of transmission. Transmissions along different beam directions may be used to identify (e.g., by a transmitting device, such as a network entity 105, or by a receiving device, such as a UE 115) a beam direction for later transmission or reception by the network entity 105.

Some signals, such as data signals associated with a particular receiving device, may be transmitted by transmitting device (e.g., a transmitting network entity 105, a transmitting UE 115) along a single beam direction (e.g., a direction associated with the receiving device, such as a receiving network entity 105 or a receiving UE 115). In some examples, the beam direction associated with transmissions along a single beam direction may be determined based on a signal that was transmitted along one or more beam directions. For example, a UE 115 may receive one or more of the signals transmitted by the network entity 105 along different directions and may report to the network entity 105 an indication of the signal that the UE 115 received with a highest signal quality or an otherwise acceptable signal quality.

In some examples, transmissions by a device (e.g., by a network entity 105 or a UE 115) may be performed using multiple beam directions, and the device may use a combination of digital precoding or beamforming to generate a combined beam for transmission (e.g., from a network entity 105 to a UE 115). The UE 115 may report feedback that indicates precoding weights for one or more beam directions, and the feedback may correspond to a configured set of beams across a system bandwidth or one or more subbands. The network entity 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted along one or more directions by a network entity 105 (e.g., a base station 140, an RU 170), a UE 115 may employ similar techniques for transmitting signals multiple times along different directions (e.g., for identifying a beam direction for subsequent transmission or reception by the UE 115) or for transmitting a signal along a single direction (e.g., for transmitting data to a receiving device).

A receiving device (e.g., a UE 115) may perform reception operations in accordance with multiple receive configurations (e.g., directional listening) when receiving various signals from a transmitting device (e.g., a network entity 105), such as synchronization signals, reference signals, beam selection signals, or other control signals. For example, a receiving device may perform reception in accordance with multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned along a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or PDCP layer may be IP-based. An RLC layer may perform packet segmentation and reassembly to communicate via logical channels. A MAC layer may perform priority handling and multiplexing of logical channels into transport channels. The MAC layer also may implement error detection techniques, error correction techniques, or both to support retransmissions to improve link efficiency. In the control plane, an RRC layer may provide establishment, configuration, and maintenance of an RRC connection between a UE 115 and a network entity 105 or a core network 130 supporting radio bearers for user plane data. A PHY layer may map transport channels to physical channels.

The UEs 115 and the network entities 105 may support retransmissions of data to increase the likelihood that data is received successfully. Hybrid automatic repeat request (HARQ) feedback is one technique for increasing the likelihood that data is received correctly via a communication link (e.g., a communication link 125, a D2D communication link 135). HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, in which case the device may provide HARQ feedback in a specific slot for data received via a previous symbol in the slot. In some other examples, the device may provide HARQ feedback in a subsequent slot, or according to some other time interval.

Some wireless communications systems may support high throughput. However, higher throughput may increase complexity a transmitting devices and receiving devices. For example, increasing throughput two-fold may require twice the computing capability at the receiver, which may correspond to twice the modem area and energy consumption. One significant factor in complexity may be channel decoding. As such, channel decoding techniques that are designed for throughput scaling may be desirable.

Some wireless communications systems may use quasi-cyclic LDPC codes. The code may be described by a base graph and liftings (e.g., protograph LDPC code). The base graph may be a small graph that captures the macroscopic properties of the code (e.g., the threshold). The base graph may be represented by a matrix (e.g., a base matrix), with columns corresponding to variable nodes of the base graph and rows corresponding to check nodes of the base graph. A transmitting device may perform a lifting procedure on the base graph. For example, each entry in the base matrix may be lifted by a circulant identity matrix, or a circularly shifted identity matrix. In some examples, the lifting operation may refer to copying the base graph Z times and connecting the Z copies of the base graph via edge permutation. Circulant may be denoted by an integer in the non-zero entries of the base graph matrix. The dimension of the identity matrix may be Z×Z, where each variable node in the base graph is associated with Z coded bits from the LDPC code. A degree of a variable node may denote a quantity of check nodes that the variable node is connected to in the base graph (e.g., a total quantity of edges or ones in the column of the base graph). Lifting may preserve the degree distribution of each coded bit.

In some systems, a base graph may be designed for asymptotic performance. Base graphs in some systems may include two punctured nodes (e.g., two punctured variable nodes), as a large degree of punctured nodes may correspond to improved asymptotic performance. However, having two punctured nodes may slow down convergence for high throughput applications. For punctured nodes to achieve a threshold reliability, a device may perform a large quantity of iterations.

The wireless communications system 100 may support LDPC coding techniques using a base graph with a single punctured node that has one or more double-edge elements. A transmitting device may generate an LDPC code according to the base graph with the single punctured node, such as a single punctured variable node. The single punctured node may have double-edged elements corresponding to two edges with a check node. The single punctured node may provide faster convergence, as the increased reliability of using a single punctured node may improve faster through iterations compared to a base graph with two punctured nodes. The punctured node having double-edge elements may improve asymptotic performance by increasing a total degree of the punctured node by support multiple edges to a same check node. The transmitting device may perform a lifting procedure on the base graph with a single punctured node that has multi-edge elements. In some examples, the transmitting device may use lifting sizes (e.g., Z values) which are larger than a threshold size. Additionally, or alternatively, the transmitting device may remove one or more edges of the base graph when using a small lifting size to prevent short cycles of the lifted graph. In some systems, for each lifting size, lifting values may be stored in a matrix. For the punctured node with multi-edge elements, the transmitting device may use a corresponding quantity of lifting values for the multi-edge elements. For example, for a double edge element, the transmitting device may use two separate lifting values for each edge of the double edge element. Techniques for storing the lifting values are described herein.

Figure 2:
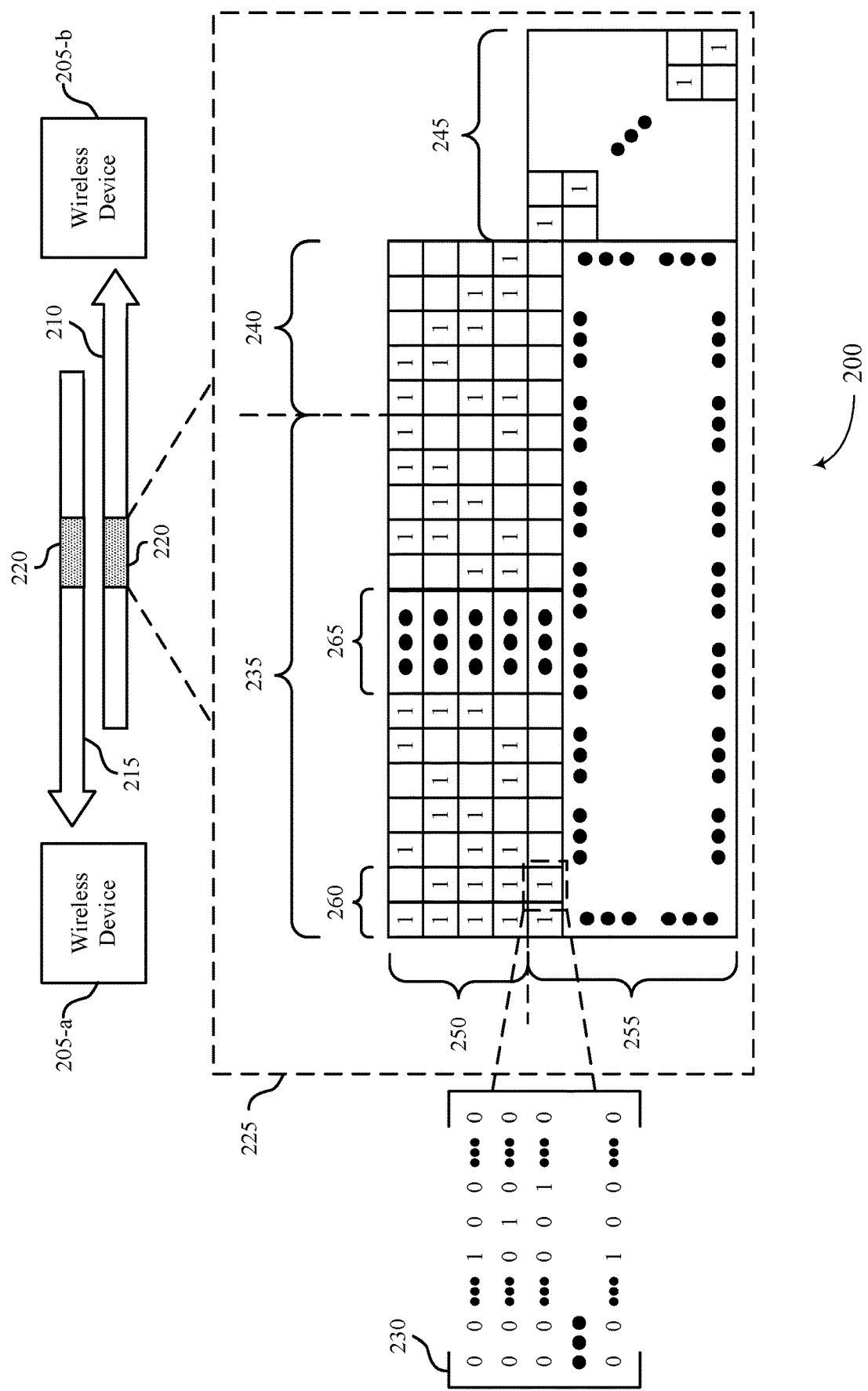
FIG. 2 shows an example of a wireless communications system that supports fast converging LDPC techniques in accordance with one or more aspects of the present disclosure.

FIG. 2 shows an example of a wireless communications system 200 that supports fast converging LDPC techniques in accordance with one or more aspects of the present disclosure. The wireless communications system may implement aspects of the wireless communications system 100 or may be implemented by aspects of the wireless communications system 100. For example, the wireless communications system 200 may include a wireless device 205-a and a wireless device 205-b, which may be examples of corresponding devices described herein (e.g., a network entity 105, a UE 115). The wireless device 205-a may communicate with the wireless device 205-b via the communication link 210 and the communication link 215. The communication link 210 and the communication link 215 may be either the uplink or the downlink, and in some cases may be a sidelink connection. A device transmitting a signal 220, or a message, (e.g., in the uplink, downlink, or sidelink) may be referred to as a transmitting device, and a device receiving the signal 220 (e.g., in the uplink, downlink, or sidelink) may be referred to as a receiving device.

The wireless communications system 200 may implement forward error correction (FEC) to reduce transmission errors when performing communications over unreliable or noisy channels. In some examples, the wireless device 205-a may be a transmitting device and may transmit a signal to the wireless device 205-b, which may be a receiving device, according to an error correction code. For example, the wireless device 205-a may transmit a signal 220 using an LDPC code (e.g., a quasi-cyclic (QC) LDPC code). The LDPC code may be described or defined by a base graph 225 (e.g., a protograph) and a lifting matrix 230. The base graph 225 may capture (e.g., represent) the macroscopic properties of the LDPC code (e.g., a threshold).

In some examples, the base graph 225 may be represented as a matrix (e.g., a base matrix). The base graph 225 may include multiple columns and multiple rows. Each column of the multiple columns of the base graph 225 may denote (e.g., be defined as) a variable node, and each row of the multiple rows of the base graph 225 may denote (e.g., may be defined as) a check node. The multiple variable nodes of the base graph 225 may be further include multiple information nodes 235, multiple core parity nodes 240, and multiple extension parity nodes 245. The multiple check nodes of the base graph 225 may include multiple core check nodes 250 and multiple extension check nodes 255. Each variable node may be associated with a degree, which may denote a quantity of check nodes associated with each variable node. For example, the degree associated with a variable node may indicate that the variable node is associated with a quantity of edges of the base graph 225 (e.g., non-zero elements of the variable node). In some cases, the first and second variable nodes of the base graph 225 may be punctured information nodes 260 (e.g., a non-transmitted node). Additionally, or alternatively, the multiple information nodes 235 may include one or more special extension check nodes 265.

The LDPC code may be further described by a lifting matrix 230. For example, the LDPC code may be described by a circulant identity matrix, and the wireless device 205-a, the wireless device 205-b, or both the wireless device 205-a and the wireless device 205-b may lift (e.g., perform a lifting operation) each entry of the base graph 225 according to the circulant identity matrix. The cyclic shift associated with the circulant identity matrix may be indicated by a non-zero value in the base graph 225. In some examples, each variable node of the base graph 225 may be associated with a quantity of coded bits associated with the LDPC code, and the dimensions of the lifting matrix 230 (e.g., width, height, or both) may be equal to the quantity of coded bits. In such examples, the wireless device 205-b, or both the wireless device 205-a and the wireless device 205-b may create a quantity of copies of the base graph 225 equal to the quantity of coded bits and may connect the quantity of copies of the base graph 225 via edge permutation. By performing the lifting operation, the wireless device 205-b, or both the wireless device 205-a and the wireless device 205-b may preserve a degree distribution of each coded bit.

The wireless device 205-a and the wireless device 205-b may perform a high-order modulation operation (e.g., 256QAM) to map the coded bits to a modulation constellation. In some examples, mapping the coded bits may be associated with an interleaver. The wireless device 205-a and the wireless device 205-b may further implement shaping (e.g., probabilistic shaping) to convert a uniform modulation constellation into a non-uniform modulation constellation. However, in some cases, a base graph 225 may not be compatible with higher-order modulation operations because generating a large quantity of complex copies of the base graph 225 (e.g., during lifting) may generate a significant increase in overhead to support high throughput of higher modulation orders.

Figure 3:
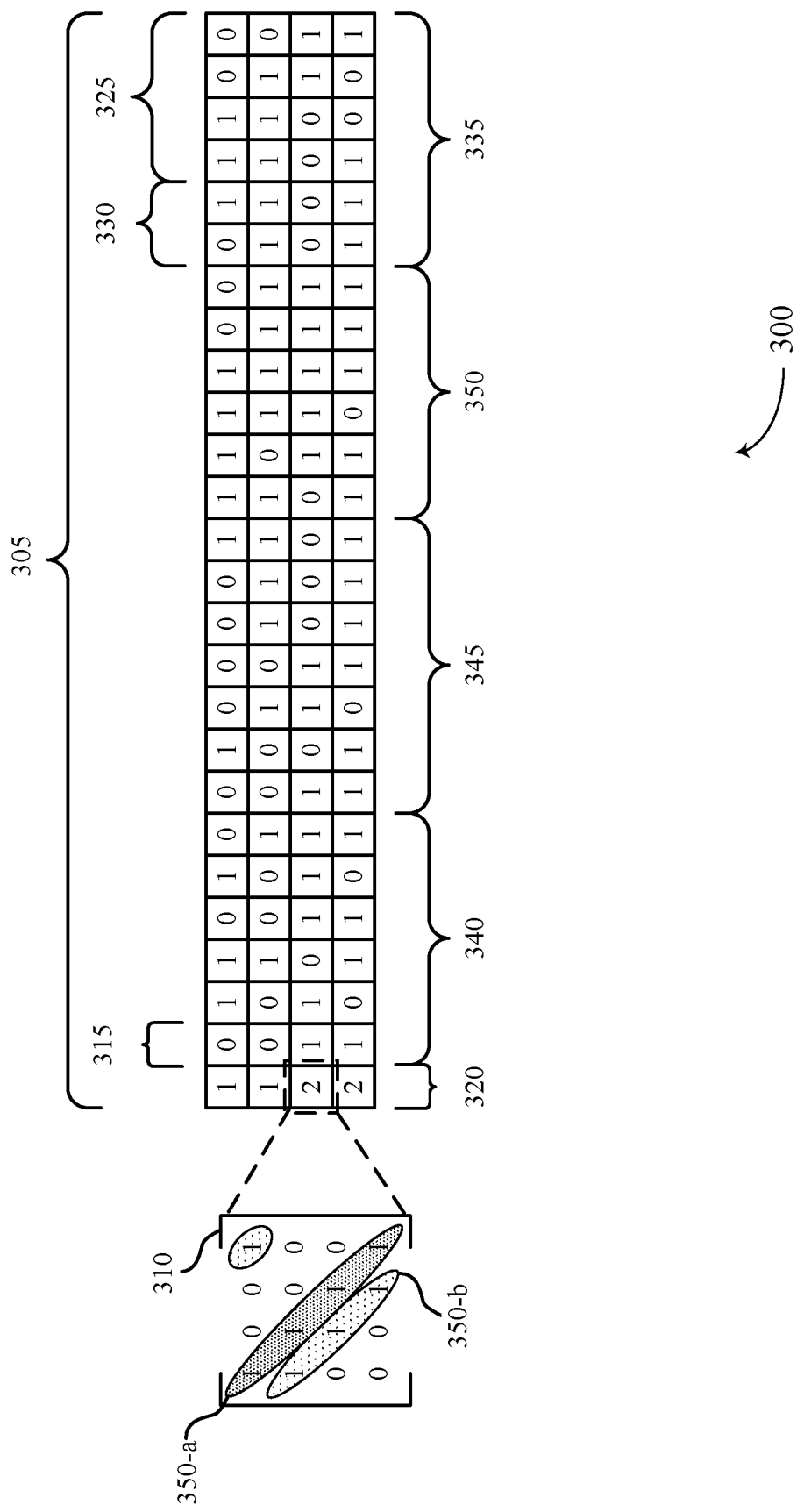
FIG. 3 shows an example of a base graph that supports fast converging LDPC techniques in accordance with one or more aspects of the present disclosure.
Figure 4:
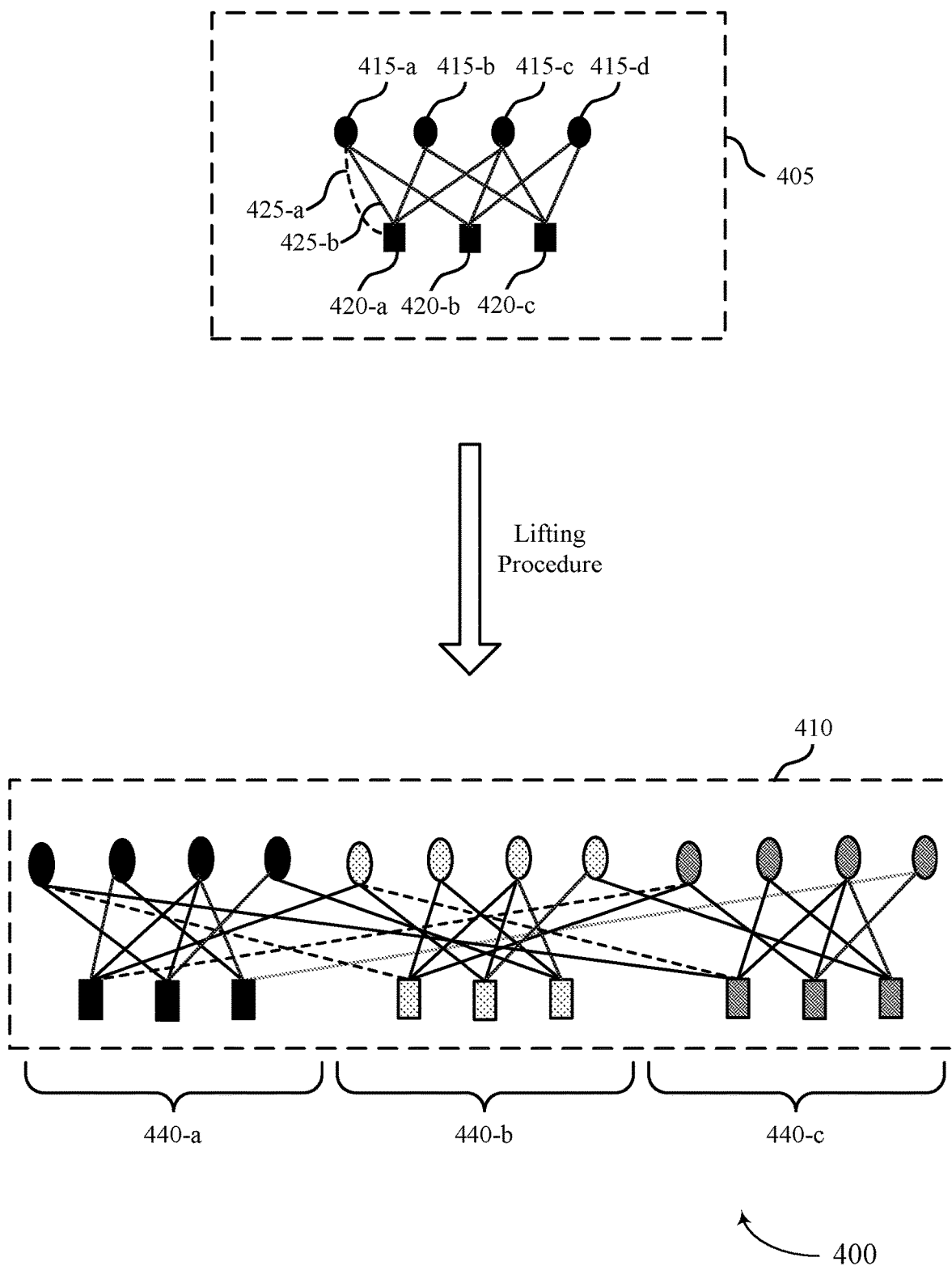
FIG. 4 shows an example of a graph lifting that supports fast converging LDPC techniques in accordance with one or more aspects of the present disclosure.
Figure 5:
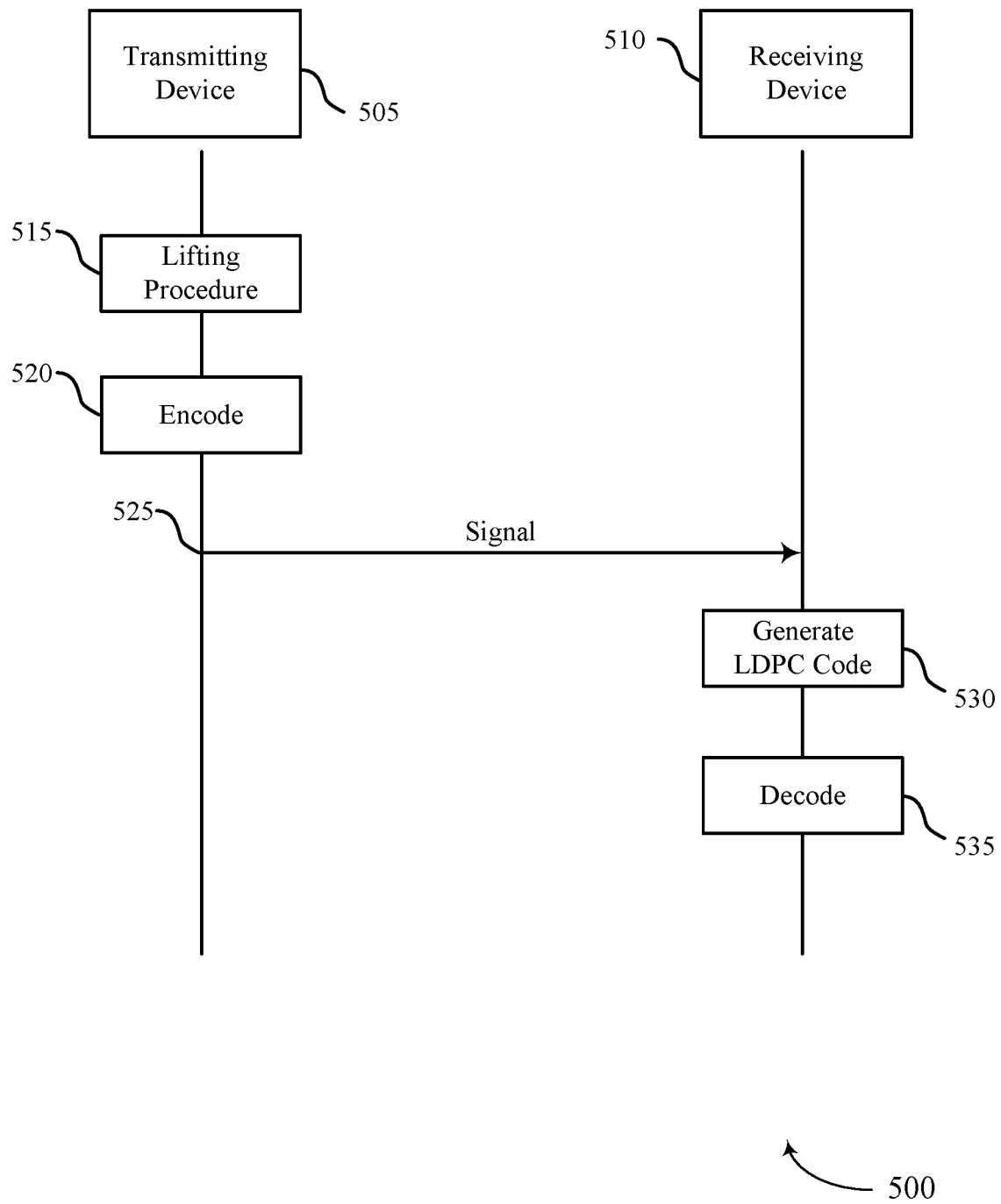
FIG. 5 shows an example of a process flow that supports fast converging LDPC techniques in accordance with one or more aspects of the present disclosure.

In some examples, as described herein with reference to FIGS. 3-5, the wireless device 205-*a* may generate an LDPC code according to a base graph, which may be defined by variable nodes (e.g., columns of the base graph 225) and check nodes (e.g., rows of the base graph 225). The base graph may include a single punctured variable node which has one or more multi-edge elements. For example, the base graph may include a single punctured variable node that has one or more double edge elements to a corresponding one or more check nodes. In some aspects, techniques for performing a lifting procedure on the base graph are described.

FIG. 3 shows an example of a base graph 300 that supports fast converging LDPC techniques in accordance with one or more aspects of the present disclosure. The base graph 300 may implement aspects of the wireless communications system 100 or the wireless communications system 200. For example, transmissions between two wireless devices (which may be examples of wireless devices 205 as described herein with reference to FIG. 2) may be encoded according to an LDPC code. In such examples, a transmitting device may transmit a signal including one or more coded bits to a receiving device based on encoding the signal. The receiving device may decode the signal based on receiving the signal and generating an LDPC code associated with the signal.

The transmitting device may generate the LDPC code based on a base graph 305. The transmitting device or the receiving device, or both, may perform lifting on the base graph 305 according to a lifting matrix 310, which may be an example of a dual-diagonal lifting matrix. The base graph 305 may include one or more variable nodes 315. The base graph 305 may include a punctured variable node 320, which may be in a first node position. In some examples, the punctured variable node 320 may be an example of a punctured variable node having double-edged or multi-edged elements. The base graph 305 may include a set of parity nodes 325 and a set of unshaped bits 330 (e.g., unshaped systematic bits). The set of unshaped bits 330 may be at the beginning of the set of information nodes of the base graph 305 or at the end of the set of information nodes of the base graph 305. In some examples, the portion of the base graph 305 shown in FIG. 3 may be an example of a core of the base graph 305.

As described herein with reference to FIG. 2, each of the one or more variable nodes 315 may be associated with a degree. In such cases, a numerical value associated with each degree may indicate that each of the one or more variable nodes 315 is associated with a quantity of check nodes similar to (e.g., equal to) the numerical value associated with each degree. For example, one or more variable nodes 315 of the base graph 305 may be associated with two check nodes (e.g., second degree nodes), and one or more variable nodes 315 of the base graph 305 may be associated with three check nodes (e.g., third degree nodes). In an example, the punctured variable node 320 may have a degree of six based on having two double-edged elements and two single-edged elements.

The base graph 305 may include a single punctured node (e.g., the punctured variable node 320), which may provide faster convergence compared to base graphs with two punctured nodes. The single punctured node may have double-edge or multi-edge elements in the base graph, which may improve asymptotic performance. For example, the total degree of punctured nodes may be increased by supporting multiple edges to a same check node. The base graph 305 may converge faster than other base graphs (e.g., based graphs with a single punctured node) and may match asymptotically. In some examples, the base graph 305 may have a larger core size than some other base graphs. The rate of the core may be greater than or equal to the rate of the core of some other systems. For example, the rate of the core of the base graph 305 may be greater than or equal to 0.88 (e.g., for high throughput scenarios).

The punctured nodes may provide threshold improvement. For example, the punctured node may increase the check node degree of the transmitted graph. The double edge structure may provide faster convergence and improved asymptotic performance. In some examples, the base graph 305 may support using an encoding chain of degree two and a HARQ extension of degree one. In some examples, the set of parity nodes 325 may have an accumulative chain structure which may be similar to some other base graphs (e.g., base graph 1). In some examples, implementing the virtual nodes may result in using 4 times the cycles for a double edge compared to a single edge. In some examples, a transmitting device or a receiving device may implement the base graph 305 using dedicated hardware or a hardware implementation associated with the base graph 305. In some examples, implementing the dedicated hardware or hardware implementation may result in using two times the cycles for a double edge compared to a single edge.

In some examples, the base graph 305 may be implemented by a device by converting a double-edge graph into a single-edge format. For example, the device may use or introduce a virtual punctured node corresponding to a special check or special layer. A decoding device may use a decoding schedule where the decoding device revisits the special layer after every layer involving the double edge. For example, the virtual punctured layer may sore a separate copy of an LLR. A parity check may equate the punctured node and the virtual node. For example, a device may effectively add a virtual row (e.g., a virtual check node) and a virtual column (e.g., a virtual variable node) to the base graph, such that a second edge between the punctured variable node is effectively moved to the virtual variable node.

The transmitting device or the receiving device, or both, may perform lifting on both edges of an entry of the punctured variable node 320 with two edges. For example, the entry of the punctured variable node 320 with two edges may be replaced by a summation of two circularly shifted identity matrices. A first identity matrix may have a first circular shift value 350-*a*, and a second identity matrix may have a second circular shift value 350-*b*. In the example shown by FIG. 3, the first circular shift value 350-*a* may be zero (e.g., the identity matrix is not circularly shifted), and the second circular shift value 350-*b* may be three. The lifting matrix 310 for the double-edge entry of the punctured variable node 320 may correspond to a summation of the two identity matrices with the respective circular shift values.

For the lifting procedure, each 1 in the base graph 305 may be replaced by a circularly shifted identity matrix. The circular shift values may be configured at the transmitting device, receiving device, or preconfigured for a wireless communications system including the transmitting device and receiving device. For each lifting size value (e.g., Z value), the lifting values (e.g., circular shift values) may be stored by a lifting value matrix. For example, a 0 in the base graph (e.g., no edge) may correspond to a −1 in the lifting value matrix. A non-zero value (e.g., 1 or 2) in the base graph may correspond to a lifting value in the lifting value matrix. To specify lifting values for double edges, the lifting value matrix may indicate two lifting values for double edges in the base graph 305. In a first example, the lifting value matrix may indicate two values, A and B. For example, the entry in the lifting value matrix that corresponds to a double edge may store both A and B, or two separate lifting values or circular shift values for the double edge. In another example, the entry in the lifting value matrix that corresponds to the double edge may store a single value that is indicative of both lifting values. For example, the entry may store a value that is based on the first lifting value, the second lifting value, and a lifting size. For example, the entry in the lifting value matrix may correspond to A+10*Z*B. In an example, for a lifting size value of Z=384, a first lifting value A of 181, and a second lifting value B of 186, the entry in the lifting value matrix may be 714421.

In the example shown by FIG. 3, the Z value or lifting size value for the base graph may be four. For example, the dimensions of the lifting matrix 310 may be Z×Z, or four columns with four rows. The Z value for FIG. 3 is exemplary, and other Z values may be used for a lifting size. In some examples, the lifting size may be less than or equal to 384. In some implementations, the lifting size may be configured to be larger than a threshold, which may prevent short cycles in an LDPC code. In some examples, Z value may be restricted or configured to be larger than a threshold size. In some implementations, some LDPC techniques described herein may only be implemented for Z values that are above a threshold size. In some examples, the transmitting device or the receiving device, or both, may remove one or more edges in the base graph, which may prevent short cycles.

In some examples, the core of the base graph 305 may have a higher occurrence or density of double edges than an extension portion of the base graph 305. In some examples, the extension portion of the base graph 305 may refer to lower check nodes, or check nodes five and beyond. The extension may have more single edges for faster convergence. For example, a majority of layers of the punctured node in the extension portion may have single edges.

In some examples, the transmitting device may map the elements of the base graph 305 (e.g., one or more parity bits and one or more unshaped bits of the coded bit) to different bits of a modulation constellation. For example, a first set of variable nodes may correspond to a first MSB 340, a second set of variable nodes may correspond to a second MSB 345, a third set of variable nodes may correspond to a third MSB 350, and a fourth set of variable nodes may correspond to the LSB 335.

A receiving device may receive a signal including information bits and parity bits according to the LDPC code. In some examples, the receiving device may generate the LDPC code according to a lifted graph. The lifted graph may include multiple connected copies of the base graph that are connected via edge permutation based on a lifting procedure. The receiving device may attempt to decode the information bits based on the parity bits, information nodes, and parity nodes. In some examples, the receiving device may perform layered decoding to decode the information bits. For example, the receiving device may decode single edge layers first then decode double edge layers. For example, the receiving device may decode the first and second layers (e.g., rows) of the base graph 305, then the receiving device may decode the third and fourth layers of the base graph 305. In some examples, the receiving device may start decoding from a lowest degree layer and finish decoding with a highest degree layer. In some examples, the receiving device may not connect a variable node to the parity checks that are decoded consecutively in the layered decoding. For example, a message update may not be ready based on a pipeline of the bits or the implementation. In some examples, asymmetric degree distribution for parity check nodes may assist layered decoding. In some examples, the base graph 305 may support degree one extension structure to assist decoding operations at the receiving device.

FIG. 4 shows an example of a graph lifting 400 that supports fast converging LDPC techniques in accordance with one or more aspects of the present disclosure. The graph lifting 400 includes a graph 405 and a lifted graph 410. The graph lifting 400 shows a lifting procedure similar to a lifting procedure that may be performed on a base graph, such as a base graph 305 described with reference to FIG. 3.

The graph 405 may include one or more variable nodes 415 and one or more check nodes 420. For example, the graph 405 may include four variable nodes 415 and three check nodes 420. An edge 425 may connect a variable node 415 and a check node 420. For example, a variable node 415-*b* may have an edge to a check node 420-*a* and a check node 420-*c*. A variable node 415-*c* may have an edge to the check node 420-*a*, a check node 420-*b*, and the check node 420-*c*. A variable node 415-*d* may have an edge to the check node 420-*b* and the check node 420-*c*.

A variable node 415-*a* may have multiple edges to a single check node. For example, the variable node 415-*a* may have a single edge to the check node 420-*b* and a double edge to the check node 420-*a*. For example, the variable node 415-*a* may be connected to the check node 420-*a* via a first edge 425-*a* and a second edge 425-*b*. A table for the graph 405 may be similar to Table 1 below. The variable node 415-*a* may have a degree of 3, the variable node 415-*b* may have a degree of 2, the variable node 415-*c* may have a degree of 3, and the variable node 415-*d* may have a degree of 2.

TABLE 1

| 2 | 1 | 1 | 0 |
|---|---|---|---|
| 1 | 0 | 1 | 1 |
| 0 | 1 | 1 | 1 |

In a lifting procedure, multiple copies of the graph 405 may be generated and connected via edge permutation. For example, the lifting procedure may generate three copies 440 of the graph 405. In some examples, a lifting procedure may include replacing each 1 of the Table 1 with a circularly shifted identity matrix and replacing the 2 of the Table 1 with a summation of two circularly shifted identity matrices.

Performing the lifting procedure on the graph 405 may generate the lifted graph 410. The lifted graph 410 may include a first copy 440-*a* of the graph 405, a second copy 440-*b*, and a third copy 440-*c*, which are all connected via edge permutation. For example, a first and last variable node 415 of each copy 440 may be connected to, or have an edge to, check nodes 420 of the other copies 440.

For a graph that has a double edge, multiple lifting values may be applied to the double edge. For example, a first circular shift value may be applied for the edge 425-*a* and a second circular shift value may be applied for the edge 425-*b*. In an example, the first circular shift value may be 2, and the second circular shift value may be 1. For example, the edge 425-*b* of the variable node 415-*a* in each copy 440 may connect to the check node 420-*a* in a copy 440 that is based on the circular shift value. The edge 425-*a* may connect the variable node 415-*a* in copy 440-*a* to the check node 420-*a* in copy 440-*c*, the edge 425-*a* may connect the variable node 415-*a* in copy 440-*b* to the check node 420-*a* in copy 440-*a*, and the edge 425-*a* may connect the variable node 415-*a* in copy 440-*c* to the check node 420-*a* in copy 440-*b*, based on the circular shift value of 2. The edge 425-*b* may connect the variable node 415-*a* in copy 440-*a* to the check node 420-*a* in copy 440-*b*, the edge 425-*a* may connect the variable node 415-*a* in copy 440-*c* to the check node 420-*a* in copy 440-*a*, and the edge 425-*a* may connect the variable node 415-*a* in copy 440-*a* to the check node 420-*a* in copy 440-*b*, based on the circular shift value of 1.

In some examples, the lifting values or circular shift values for each lifting size may be stored in a lifting value matrix. In some examples, the lifting values for each lifting size (e.g., Z) may be preconfigured. An entry of a lifting value matrix corresponding to multiple edges may be indicative of a corresponding multiple lifting values. For example, the entry of the lifting value matrix corresponding to a double edge may include two lifting values. In some examples, the entry of the lifting value matrix corresponding to a double edge may include a single value that is indicative of two separate lifting values. For example, the single value may be determined or calculated based on the two separate lifting value and a lifting size. In some examples, the lifting value matrix may be stored in one or more memories at a transmitting device or a receiving device, or both.

FIG. 5 shows an example of a process flow 500 that supports fast converging LDPC techniques in accordance with one or more aspects of the present disclosure. The process flow 500 may implement or be implemented by aspects of the wireless communications system 100 and the wireless communications system 200 as described herein with reference to FIGS. 1 and 2. The process flow 500 may be implemented by a transmitting device 505 or a receiving device 510, or both. The transmitting device 505 and the receiving device 510 may each be an example of a device described with reference to FIG. 1, such as a UE 115 or an network entity 105. A device transmitting a signal, or a message, (e.g., in the uplink, downlink, or sidelink) may be referred to as a transmitting device 505, and a device receiving the transmitted signal (e.g., in the uplink, downlink, or sidelink) may be referred to as a receiving device 510. In the following description of the process flow 500, the operations between the wireless devices may be transmitted in a different order than the example order shown, or the operations between the wireless devices may be performed in different orders at different times. Some operations may also be omitted from the process flow 500, and other operations may be added to the process flow 500.

At 515, the transmitting device 505 may perform a lifting procedure on a base graph. For example, the transmitting device 505 may perform a lifting procedure on a base graph including a set of multiple variable nodes and a set of multiple check nodes to obtain a lifted graph. In the base graph, a punctured variable node of the set of multiple variable nodes may correspond to each of one or more check nodes of the set of multiple check nodes via a set of multiple edges. For example, the punctured variable node may include one or more double edge elements. In some examples, the base graph may include a single punctured variable node.

The lifting procedure may include replacing each edge between the set of multiple variable nodes and the set of multiple check nodes of the base graph with a respective set of multiple identity matrices with respective circular shift values. In some examples, the lifting procedure may include generating multiple copies of the base graph that are connected via edge permutation based on replacing each edge between the set of multiple variable nodes and the set of multiple check nodes with the respective set of multiple identity matrices with respective circular shift values. For elements that correspond to double edges, the entry may be replaced with a summation of two identity matrices with respective circular shift values.

At 520, the transmitting device 505 may encode a set of multiple information nodes and a set of multiple parity nodes according to the lifted graph. At 525, the transmitting device 505 may transmit a signal include a set of multiple information bits and a set of multiple parity bits based on encoding the set of multiple information nodes and the set of multiple parity nodes. The receiving device 510 may receive the signal including the set of multiple information bits and the set of multiple parity bits corresponding to an LDPC code.

At 530, the receiving device 510 may generate the LDPC code. For example, the receiving device 510 may generate the LDPC code according to a lifted graph including multiple connected copies of the base graph based on the lifting procedure.

At 535, receiving device 510 may decode the set of multiple information bits based on the set of multiple parity bits, a set of multiple information nodes, and a set of multiple parity nodes. The set of multiple information nodes and the set of multiple parity nodes may correspond to the base graph.

In some examples, the receiving device 510 may perform layered decoding. For example, the receiving device 510 may decode a first set of information bits associated with a first check node that is connected to the punctured variable node via a single edge. Then, the receiving device 510 may decode, after the first set of information bits, a second set of information bits associated with a second check node of the one or more check nodes that are connected to the punctured variable node via the plurality of edges.

Additionally, or alternatively, the receiving device 510 may start decoding lower degree layers and then start decoding higher degree layers. For example, the receiving device 510 may decode a first set of information bits associated with a first set of information nodes of the set of multiple information nodes based on the first set of information nodes having a single edge and a first degree of edges. Then, the receiving device may decode, after decoding the first set of information bits, a second set of information bits associated with a second set of information nodes of the set of multiple information nodes having a single edge and a second degree of edges that is greater than the first degree of edges. For example, the receiving device may decode single edge layers first then decode double edge layers.

Figure 6:
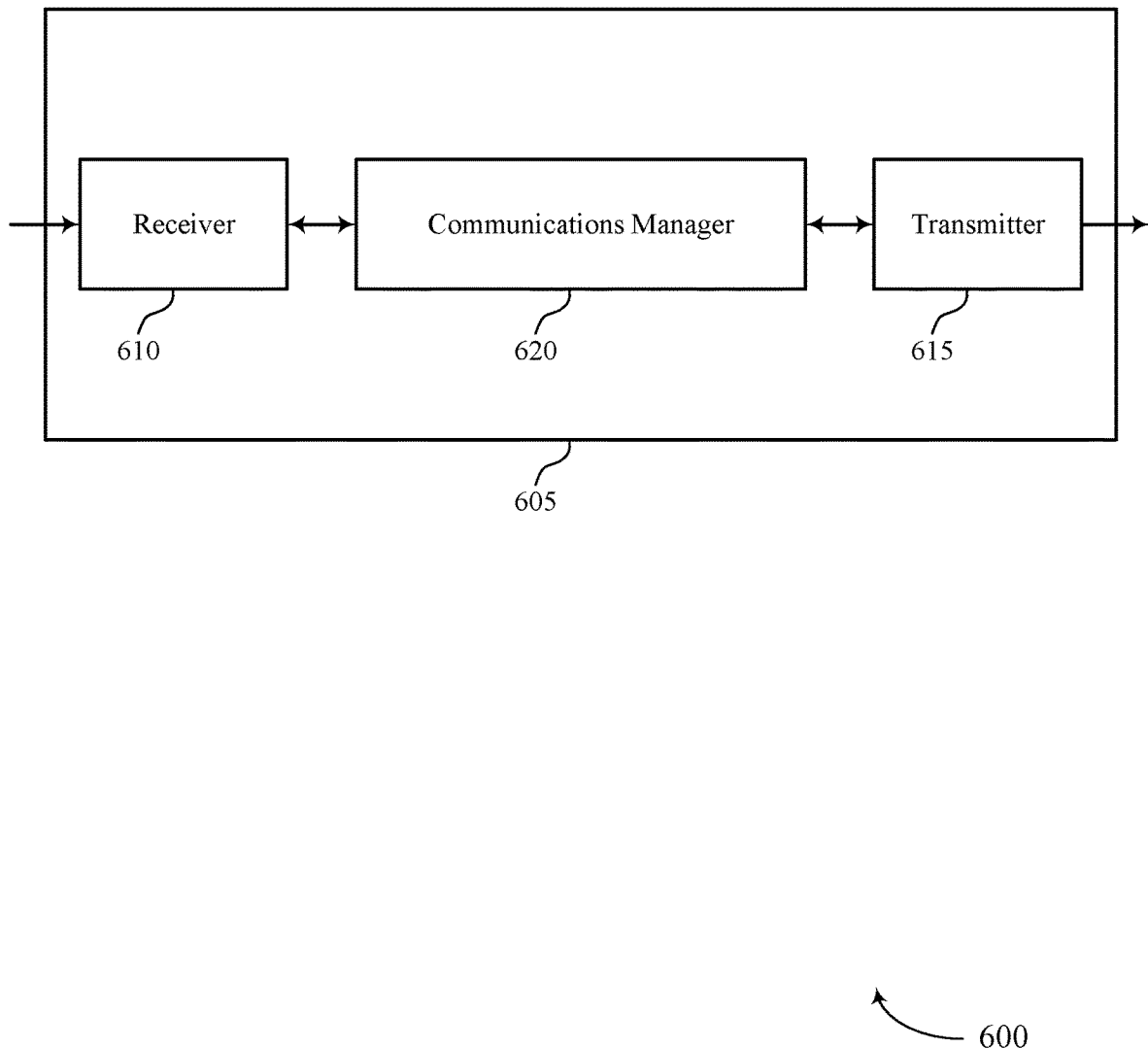
FIGS. 6 and 7 show block diagrams of devices that support fast converging LDPC techniques in accordance with one or more aspects of the present disclosure.

FIG. 6 shows a block diagram 600 of a device 605 that supports fast converging LDPC techniques in accordance with one or more aspects of the present disclosure. The device 605 may be an example of aspects of a UE 115 as described herein. The device 605 may include a receiver 610, a transmitter 615, and a communications manager 620. The device 605, or one or more components of the device 605 (e.g., the receiver 610, the transmitter 615, and the communications manager 620), may include at least one processor, which may be coupled with at least one memory, to, individually or collectively, support or enable the described techniques. Each of these components may be in communication with one another (e.g., via one or more buses).

The receiver 610 may provide a means for receiving information such as packets, user data, control information, or any combination thereof associated with various information channels (e.g., control channels, data channels, information channels related to fast converging LDPC techniques). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to fast converging LDPC techniques). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of fast converging LDPC techniques as described herein. For example, the communications manager 620, the receiver 610, the transmitter 615, or various combinations or components thereof may be capable of performing one or more of the functions described herein.

In some examples, the communications manager 620, the receiver 610, the transmitter 615, or various combinations or components thereof may be implemented in hardware (e.g., in communications management circuitry). The hardware may include at least one of a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 620, the receiver 610, the transmitter 615, or various combinations or components thereof may be implemented in code (e.g., as communications management software or firmware) executed by at least one processor. If implemented in code executed by at least one processor, the functions of the communications manager 620, the receiver 610, the transmitter 615, or various combinations or components thereof may be performed by a general-purpose processor, a DSP, a CPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 620 may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications in accordance with examples as disclosed herein. For example, the communications manager 620 is capable of, configured to, or operable to support a means for performing a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges. The communications manager 620 is capable of, configured to, or operable to support a means for encoding a set of multiple information nodes and a set of multiple parity nodes according to the lifted graph. The communications manager 620 is capable of, configured to, or operable to support a means for transmitting a signal including a set of multiple information bits and a set of multiple parity bits based on encoding the set of multiple information nodes and the set of multiple parity nodes.

By including or configuring the communications manager 620 in accordance with examples as described herein, the device 605 (e.g., at least one processor controlling or otherwise coupled with the receiver 610, the transmitter 615, the communications manager 620, or a combination thereof) may support techniques for faster convergence for decoding LDPC codes.

Figure 7:
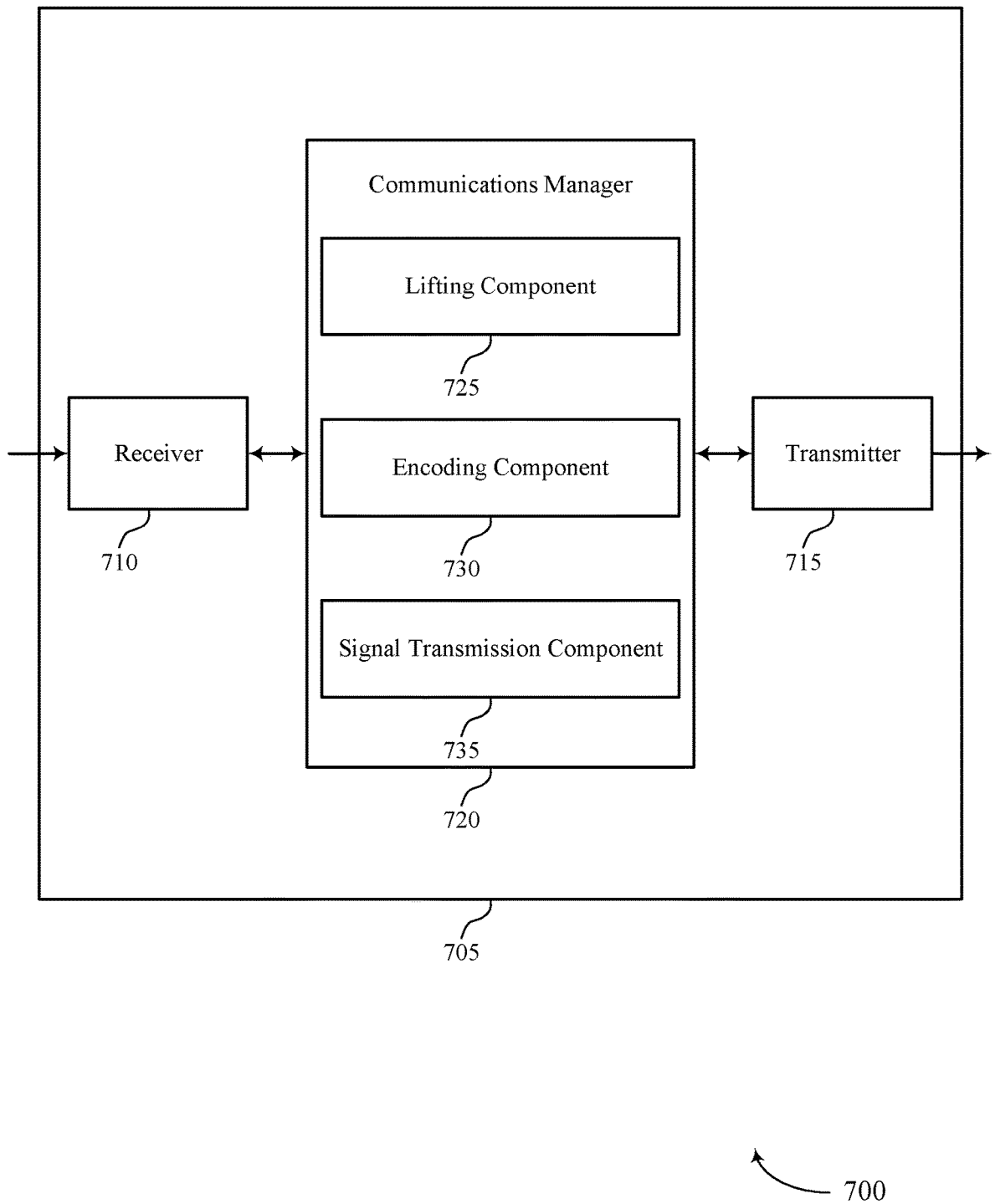

FIG. 7 shows a block diagram 700 of a device 705 that supports fast converging LDPC techniques in accordance with one or more aspects of the present disclosure. The device 705 may be an example of aspects of a device 605 or a UE 115 as described herein. The device 705 may include a receiver 710, a transmitter 715, and a communications manager 720. The device 705, or one of more components of the device 705 (e.g., the receiver 710, the transmitter 715, and the communications manager 720), may include at least one processor, which may be coupled with at least one memory, to support the described techniques. Each of these components may be in communication with one another (e.g., via one or more buses).

The receiver 710 may provide a means for receiving information such as packets, user data, control information, or any combination thereof associated with various information channels (e.g., control channels, data channels, information channels related to fast converging LDPC techniques). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to fast converging LDPC techniques). In some examples, the transmitter 715 may be co-located with a receiver 710 in a transceiver module. The transmitter 715 may utilize a single antenna or a set of multiple antennas.

The device 705, or various components thereof, may be an example of means for performing various aspects of fast converging LDPC techniques as described herein. For example, the communications manager 720 may include a lifting component 725, an encoding component 730, a signal transmission component 735, or any combination thereof. The communications manager 720 may be an example of aspects of a communications manager 620 as described herein. In some examples, the communications manager 720, or various components thereof, may be configured to perform various operations (e.g., receiving, obtaining, monitoring, outputting, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to obtain information, output information, or perform various other operations as described herein.

The communications manager 720 may support wireless communications in accordance with examples as disclosed herein. The lifting component 725 is capable of, configured to, or operable to support a means for performing a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges. The encoding component 730 is capable of, configured to, or operable to support a means for encoding a set of multiple information nodes and a set of multiple parity nodes according to the lifted graph. The signal transmission component 735 is capable of, configured to, or operable to support a means for transmitting a signal including a set of multiple information bits and a set of multiple parity bits based on encoding the set of multiple information nodes and the set of multiple parity nodes.

Figure 8:
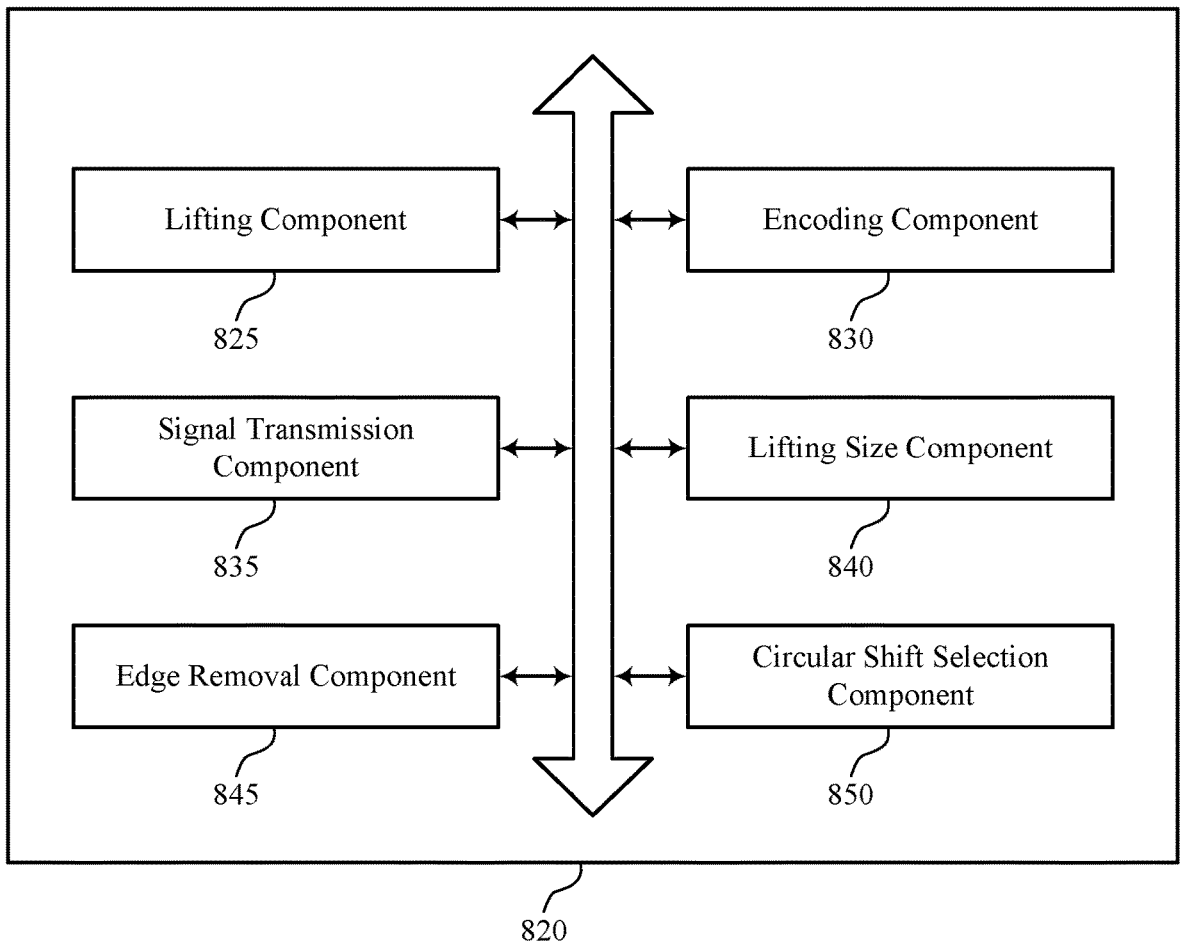
FIG. 8 shows a block diagram of a communications manager that supports fast converging LDPC techniques in accordance with one or more aspects of the present disclosure.

FIG. 8 shows a block diagram 800 of a communications manager 820 that supports fast converging LDPC techniques in accordance with one or more aspects of the present disclosure. The communications manager 820 may be an example of aspects of a communications manager 620, a communications manager 720, or both, as described herein. The communications manager 820, or various components thereof, may be an example of means for performing various aspects of fast converging LDPC techniques as described herein. For example, the communications manager 820 may include a lifting component 825, an encoding component 830, a signal transmission component 835, a lifting size component 840, an edge removal component 845, a circular shift selection component 850, or any combination thereof. Each of these components, or components or subcomponents thereof (e.g., one or more processors, one or more memories), may communicate, directly or indirectly, with one another (e.g., via one or more buses).

The communications manager 820 may support wireless communications in accordance with examples as disclosed herein. The lifting component 825 is capable of, configured to, or operable to support a means for performing a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges. The encoding component 830 is capable of, configured to, or operable to support a means for encoding a set of multiple information nodes and a set of multiple parity nodes according to the lifted graph. The signal transmission component 835 is capable of, configured to, or operable to support a means for transmitting a signal including a set of multiple information bits and a set of multiple parity bits based on encoding the set of multiple information nodes and the set of multiple parity nodes.

In some examples, the lifting size component 840 is capable of, configured to, or operable to support a means for selecting a size for the lifted graph based on a quantity of coded bits satisfying a threshold quantity of bits.

In some examples, the edge removal component 845 is capable of, configured to, or operable to support a means for removing one or more edges from the set of multiple edges based on a quantity of coded bits satisfying a threshold quantity of bits, where replacing each edge between the set of multiple variable nodes and the set of multiple check nodes is based on removing the one or more edges from the set of multiple edges.

In some examples, the base graph includes a single punctured node. In some examples, the punctured variable node is the single punctured node.

In some examples, to support encoding the set of multiple information nodes and the set of multiple parity nodes, the lifting component 825 is capable of, configured to, or operable to support a means for replacing the set of multiple edges between the punctured variable node and the one or more check nodes with a summation of a respective set of multiple identity matrices with respective circular shift values.

In some examples, a size of the lifted graph is based on a codeblock length and a length of the base graph.

In some examples, to perform the lifting procedure, the lifting component 825 is capable of, configured to, or operable to support a means for generating a multiple copies of the base graph that are connected via edge permutation based on replacing each edge between the set of multiple variable nodes and the set of multiple check nodes with the respective set of multiple identity matrices with respective circular shift values.

In some examples, to support performing the lifting procedure, the circular shift selection component 850 is capable of, configured to, or operable to support a means for determining, from a table, the respective circular shift values of the respective set of multiple identity matrices for each edge of the base graph.

In some examples, the table includes a set of multiple circular shift values for each identity matrix applied to the set of multiple edges associated with the punctured variable node.

In some examples, the table includes a singular value indicative of a set of multiple circular shift values for each identity matrix applied to the set of multiple edges associated with the punctured variable node based on a size of the lifted graph.

In some examples, to support encoding the set of multiple information nodes and the set of multiple parity nodes, the encoding component 830 is capable of, configured to, or operable to support a means for encoding the set of multiple information nodes and the set of multiple parity nodes in accordance with a second degree encoding chain and a first degree HARQ extension.

In some examples, a core portion of the base graph includes a higher density of double edges to check nodes than an extension portion of the base graph.

In some examples, the extension portion of the base graph includes a higher density of single edges to check nodes than the core portion of the base graph.

Figure 9:
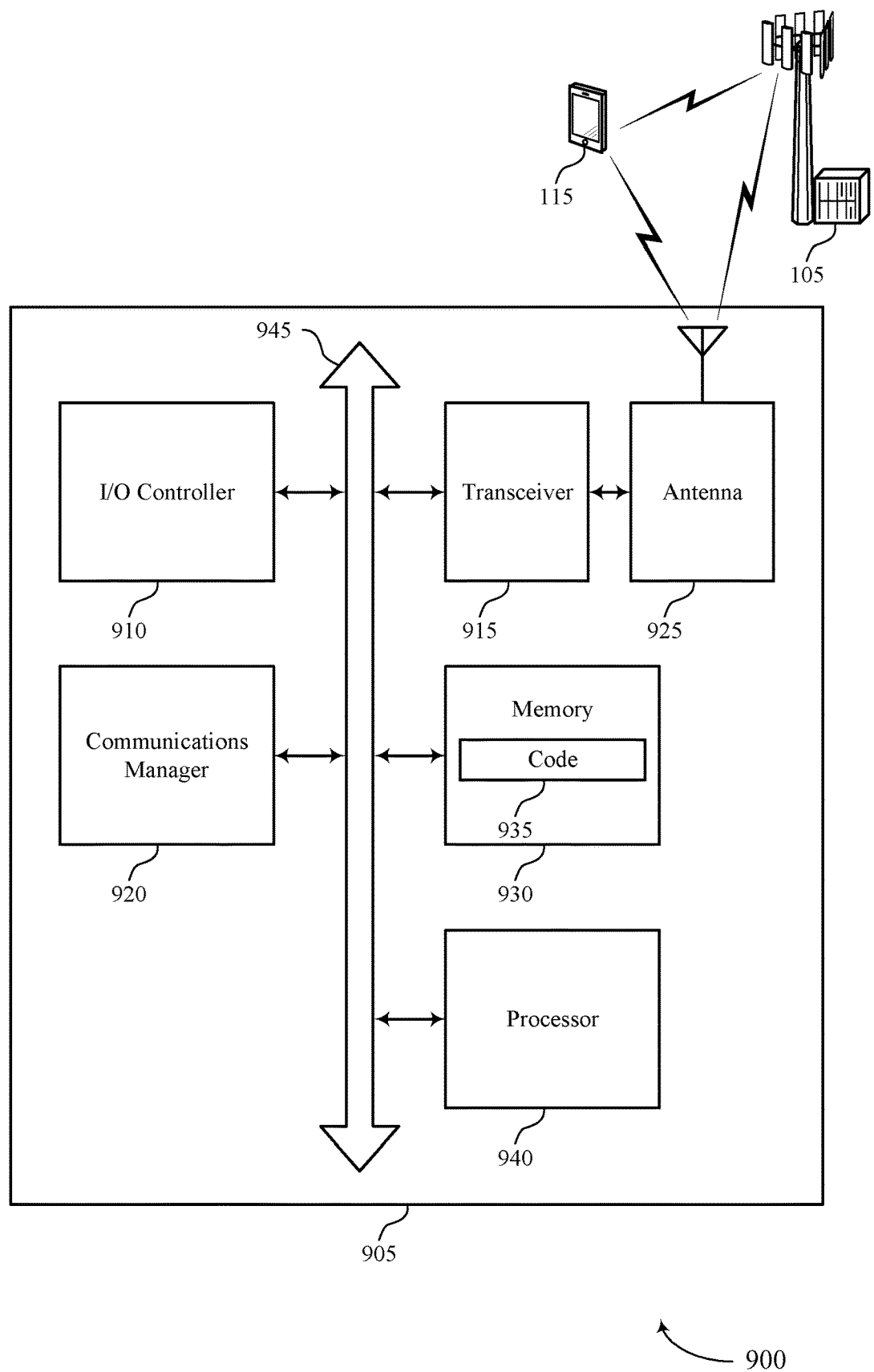
FIG. 9 shows a diagram of a system including a device that supports fast converging LDPC techniques in accordance with one or more aspects of the present disclosure.

FIG. 9 shows a diagram of a system 900 including a device 905 that supports fast converging LDPC techniques in accordance with one or more aspects of the present disclosure. The device 905 may be an example of or include the components of a device 605, a device 705, or a UE 115 as described herein. The device 905 may communicate (e.g., wirelessly) with one or more network entities 105, one or more UEs 115, or any combination thereof. The device 905 may include components for bi-directional voice and data communications including components for transmitting and receiving communications, such as a communications manager 920, an input/output (I/O) controller 910, a transceiver 915, an antenna 925, at least one memory 930, code 935, and at least one processor 940. These components may be in electronic communication or otherwise coupled (e.g., operatively, communicatively, functionally, electronically, electrically) via one or more buses (e.g., a bus 945).

The I/O controller 910 may manage input and output signals for the device 905. The I/O controller 910 may also manage peripherals not integrated into the device 905. In some cases, the I/O controller 910 may represent a physical connection or port to an external peripheral. In some cases, the I/O controller 910 may utilize an operating system such as iOS®, ANDROID®, MS-DOS®, MS-WINDOWS®, OS/2®, UNIX®, LINUX®, or another known operating system. Additionally or alternatively, the I/O controller 910 may represent or interact with a modem, a keyboard, a mouse, a touchscreen, or a similar device. In some cases, the I/O controller 910 may be implemented as part of one or more processors, such as the at least one processor 940. In some cases, a user may interact with the device 905 via the I/O controller 910 or via hardware components controlled by the I/O controller 910.

In some cases, the device 905 may include a single antenna 925. However, in some other cases, the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The at least one memory 930 may include random access memory (RAM) and read-only memory (ROM). The at least one memory 930 may store computer-readable, computer-executable code 935 including instructions that, when executed by the at least one processor 940, cause the device 905 to perform various functions described herein. The code 935 may be stored in a non-transitory computer-readable medium such as system memory or another type of memory. In some cases, the code 935 may not be directly executable by the at least one processor 940 but may cause a computer (e.g., when compiled and executed) to perform functions described herein. In some cases, the at least one memory 930 may contain, among other things, a basic I/O system (BIOS) which may control basic hardware or software operation such as the interaction with peripheral components or devices.

The at least one processor 940 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the at least one processor 940 may be configured to operate a memory array using a memory controller. In some other cases, a memory controller may be integrated into the at least one processor 940. The at least one processor 940 may be configured to execute computer-readable instructions stored in a memory (e.g., the at least one memory 930) to cause the device 905 to perform various functions (e.g., functions or tasks supporting fast converging LDPC techniques). For example, the device 905 or a component of the device 905 may include at least one processor 940 and at least one memory 930 coupled with or to the at least one processor 940, the at least one processor 940 and at least one memory 930 configured to perform various functions described herein. In some examples, the at least one processor 940 may include multiple processors and the at least one memory 930 may include multiple memories. One or more of the multiple processors may be coupled with one or more of the multiple memories, which may, individually or collectively, be configured to perform various functions herein. In some examples, the at least one processor 940 may be a component of a processing system, which may refer to a system (such as a series) of machines, circuitry (including, for example, one or both of processor circuitry (which may include the at least one processor 940) and memory circuitry (which may include the at least one memory 930)), or components, that receives or obtains inputs and processes the inputs to produce, generate, or obtain a set of outputs. The processing system may be configured to perform one or more of the functions described herein. As such, the at least one processor 940 or a processing system including the at least one processor 940 may be configured to, configurable to, or operable to cause the device 905 to perform one or more of the functions described herein. Further, as described herein, being "configured to," being "configurable to," and being "operable to" may be used interchangeably and may be associated with a capability, when executing code stored in the at least one memory 930 or otherwise, to perform one or more of the functions described herein.

The communications manager 920 may support wireless communications in accordance with examples as disclosed herein. For example, the communications manager 920 is capable of, configured to, or operable to support a means for performing a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges. The communications manager 920 is capable of, configured to, or operable to support a means for encoding a set of multiple information nodes and a set of multiple parity nodes according to the lifted graph. The communications manager 920 is capable of, configured to, or operable to support a means for transmitting a signal including a set of multiple information bits and a set of multiple parity bits based on encoding the set of multiple information nodes and the set of multiple parity nodes.

By including or configuring the communications manager 920 in accordance with examples as described herein, the device 905 may support techniques for faster convergence with asymptotic performance for LDPC codes.

In some examples, the communications manager 920 may be configured to perform various operations (e.g., receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the at least one processor 940, the at least one memory 930, the code 935, or any combination thereof. For example, the code 935 may include instructions executable by the at least one processor 940 to cause the device 905 to perform various aspects of fast converging LDPC techniques as described herein, or the at least one processor 940 and the at least one memory 930 may be otherwise configured to, individually or collectively, perform or support such operations.

Figure 10:
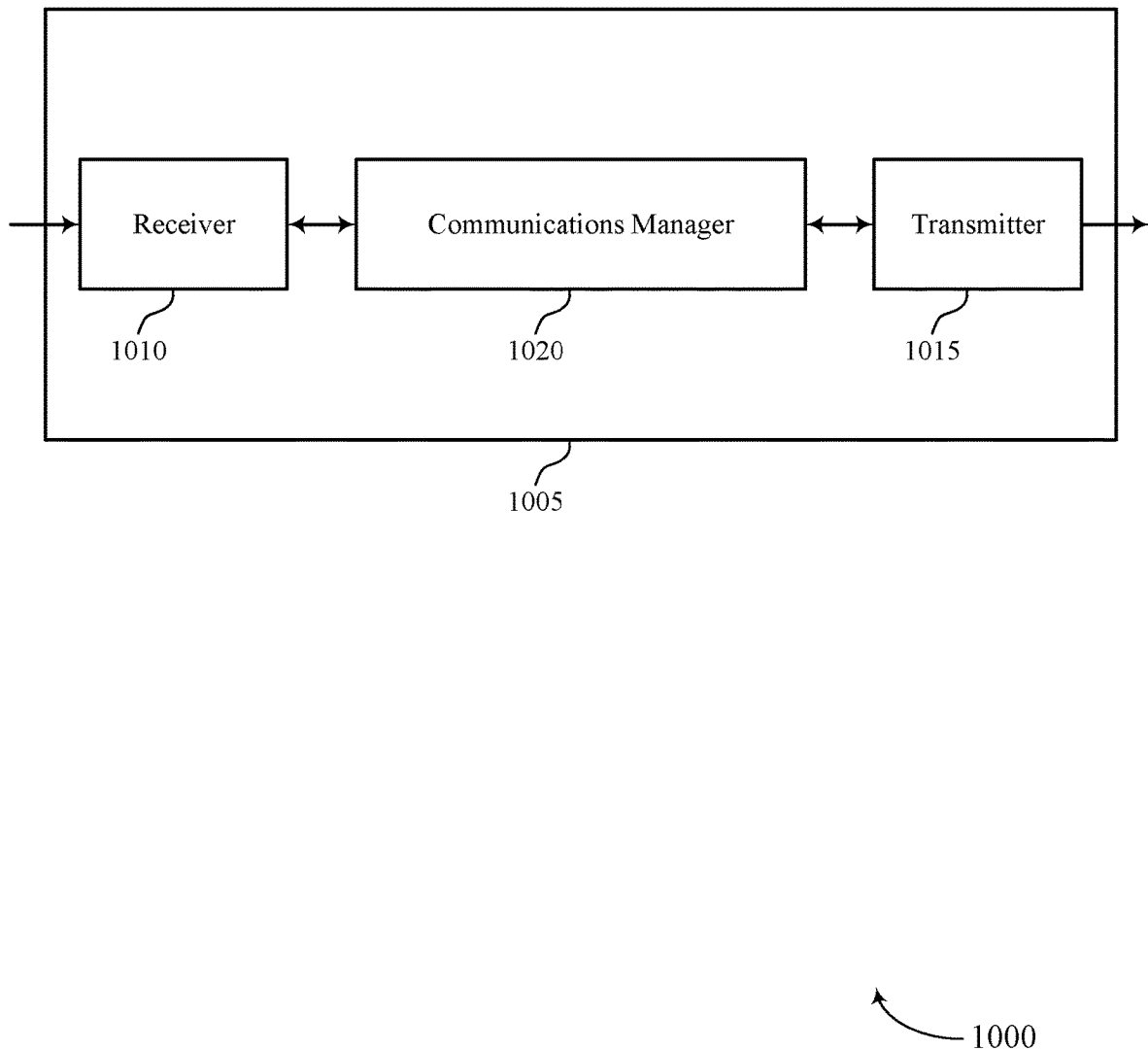
FIGS. 10 and 11 show block diagrams of devices that support fast converging LDPC techniques in accordance with one or more aspects of the present disclosure.

FIG. 10 shows a block diagram 1000 of a device 1005 that supports fast converging LDPC techniques in accordance with one or more aspects of the present disclosure. The device 1005 may be an example of aspects of a network entity 105 as described herein. The device 1005 may include a receiver 1010, a transmitter 1015, and a communications manager 1020. The device 1005, or one or more components of the device 1005 (e.g., the receiver 1010, the transmitter 1015, and the communications manager 1020), may include at least one processor, which may be coupled with at least one memory, to, individually or collectively, support or enable the described techniques. Each of these components may be in communication with one another (e.g., via one or more buses).

The receiver 1010 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 1005. In some examples, the receiver 1010 may support obtaining information by receiving signals via one or more antennas. Additionally, or alternatively, the receiver 1010 may support obtaining information by receiving signals via one or more wired (e.g., electrical, fiber optic) interfaces, wireless interfaces, or any combination thereof.

The transmitter 1015 may provide a means for outputting (e.g., transmitting, providing, conveying, sending) information generated by other components of the device 1005. For example, the transmitter 1015 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 1015 may support outputting information by transmitting signals via one or more antennas. Additionally, or alternatively, the transmitter 1015 may support outputting information by transmitting signals via one or more wired (e.g., electrical, fiber optic) interfaces, wireless interfaces, or any combination thereof. In some examples, the transmitter 1015 and the receiver 1010 may be co-located in a transceiver, which may include or be coupled with a modem.

The communications manager 1020, the receiver 1010, the transmitter 1015, or various combinations thereof or various components thereof may be examples of means for performing various aspects of fast converging LDPC techniques as described herein. For example, the communications manager 1020, the receiver 1010, the transmitter 1015, or various combinations or components thereof may be capable of performing one or more of the functions described herein.

In some examples, the communications manager 1020, the receiver 1010, the transmitter 1015, or various combinations or components thereof may be implemented in hardware (e.g., in communications management circuitry). The hardware may include at least one of a processor, a DSP, a CPU, an ASIC, an FPGA or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 1020, the receiver 1010, the transmitter 1015, or various combinations or components thereof may be implemented in code (e.g., as communications management software or firmware) executed by at least one processor. If implemented in code executed by at least one processor, the functions of the communications manager 1020, the receiver 1010, the transmitter 1015, or various combinations or components thereof may be performed by a general-purpose processor, a DSP, a CPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 1020 may be configured to perform various operations (e.g., receiving, obtaining, monitoring, outputting, transmitting) using or otherwise in cooperation with the receiver 1010, the transmitter 1015, or both. For example, the communications manager 1020 may receive information from the receiver 1010, send information to the transmitter 1015, or be integrated in combination with the receiver 1010, the transmitter 1015, or both to obtain information, output information, or perform various other operations as described herein.

The communications manager 1020 may support wireless communications in accordance with examples as disclosed herein. For example, the communications manager 1020 is capable of, configured to, or operable to support a means for receiving a signal including a set of multiple information bits and a set of multiple parity bits corresponding to an LDPC code. The communications manager 1020 is capable of, configured to, or operable to support a means for generating the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges. The communications manager 1020 is capable of, configured to, or operable to support a means for decoding the set of multiple information bits based on the set of multiple parity bits, a set of multiple information nodes, and a set of multiple parity nodes, the set of multiple information nodes and the set of multiple parity nodes corresponding to the base graph.

By including or configuring the communications manager 1020 in accordance with examples as described herein, the device 1005 (e.g., at least one processor controlling or otherwise coupled with the receiver 1010, the transmitter 1015, the communications manager 1020, or a combination thereof) may support techniques for faster convergence with asymptotic performance for LDPC codes.

Figure 11:
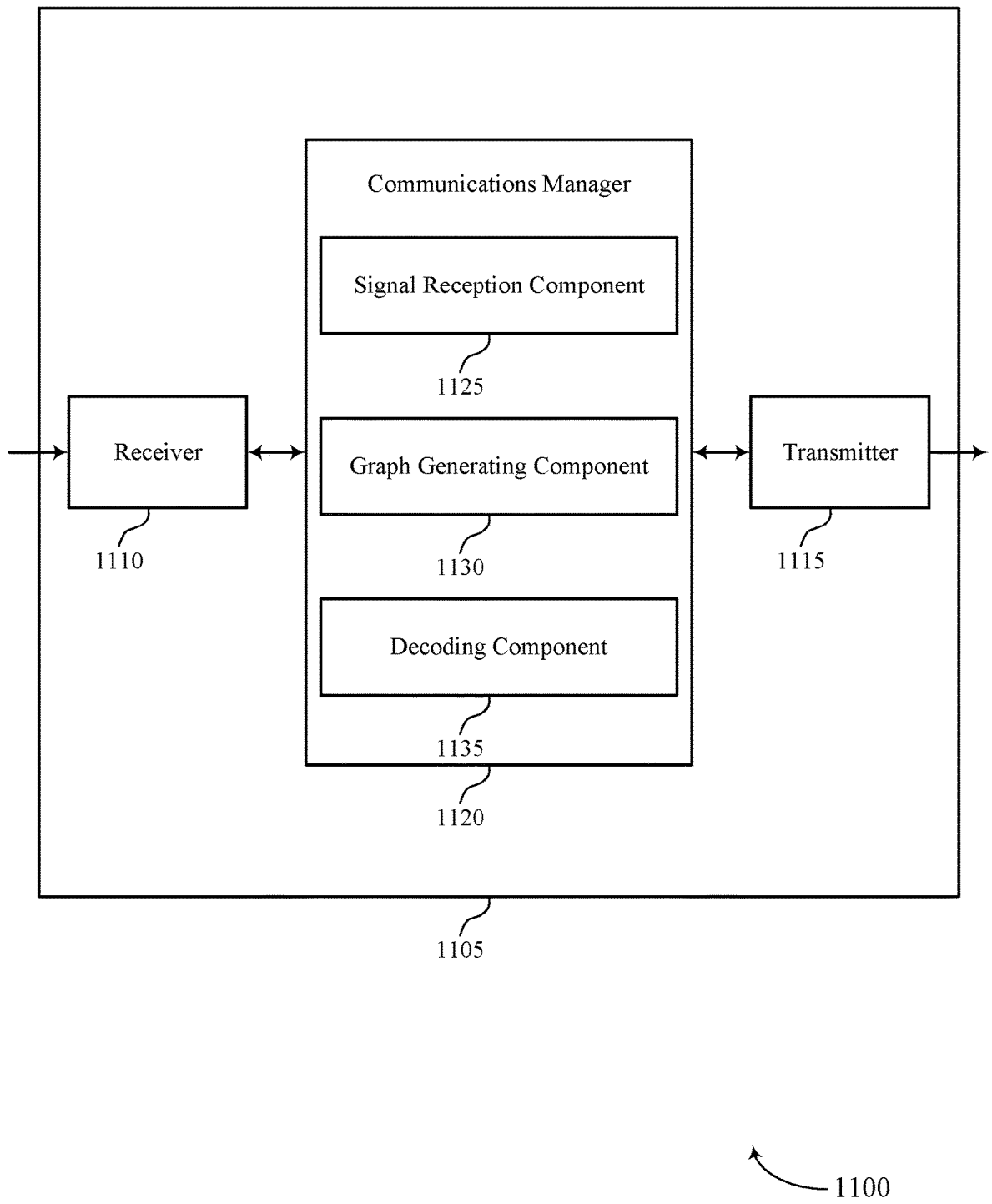

FIG. 11 shows a block diagram 1100 of a device 1105 that supports fast converging LDPC techniques in accordance with one or more aspects of the present disclosure. The device 1105 may be an example of aspects of a device 1005 or a network entity 105 as described herein. The device 1105 may include a receiver 1110, a transmitter 1115, and a communications manager 1120. The device 1105, or one of more components of the device 1105 (e.g., the receiver 1110, the transmitter 1115, and the communications manager 1120), may include at least one processor, which may be coupled with at least one memory, to support the described techniques. Each of these components may be in communication with one another (e.g., via one or more buses).

The receiver 1110 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 1105. In some examples, the receiver 1110 may support obtaining information by receiving signals via one or more antennas. Additionally, or alternatively, the receiver 1110 may support obtaining information by receiving signals via one or more wired (e.g., electrical, fiber optic) interfaces, wireless interfaces, or any combination thereof.

The transmitter 1115 may provide a means for outputting (e.g., transmitting, providing, conveying, sending) information generated by other components of the device 1105. For example, the transmitter 1115 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 1115 may support outputting information by transmitting signals via one or more antennas. Additionally, or alternatively, the transmitter 1115 may support outputting information by transmitting signals via one or more wired (e.g., electrical, fiber optic) interfaces, wireless interfaces, or any combination thereof. In some examples, the transmitter 1115 and the receiver 1110 may be co-located in a transceiver, which may include or be coupled with a modem.

The device 1105, or various components thereof, may be an example of means for performing various aspects of fast converging LDPC techniques as described herein. For example, the communications manager 1120 may include a signal reception component 1125, a graph generating component 1130, a decoding component 1135, or any combination thereof. The communications manager 1120 may be an example of aspects of a communications manager 1020 as described herein. In some examples, the communications manager 1120, or various components thereof, may be configured to perform various operations (e.g., receiving, obtaining, monitoring, outputting, transmitting) using or otherwise in cooperation with the receiver 1110, the transmitter 1115, or both. For example, the communications manager 1120 may receive information from the receiver 1110, send information to the transmitter 1115, or be integrated in combination with the receiver 1110, the transmitter 1115, or both to obtain information, output information, or perform various other operations as described herein.

The communications manager 1120 may support wireless communications in accordance with examples as disclosed herein. The signal reception component 1125 is capable of, configured to, or operable to support a means for receiving a signal including a set of multiple information bits and a set of multiple parity bits corresponding to an LDPC code. The graph generating component 1130 is capable of, configured to, or operable to support a means for generate the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges. The decoding component 1135 is capable of, configured to, or operable to support a means for decode the set of multiple information bits based on the set of multiple parity bits, a set of multiple information nodes, and a set of multiple parity nodes, the set of multiple information nodes and the set of multiple parity nodes corresponding to the base graph.

Figure 12:
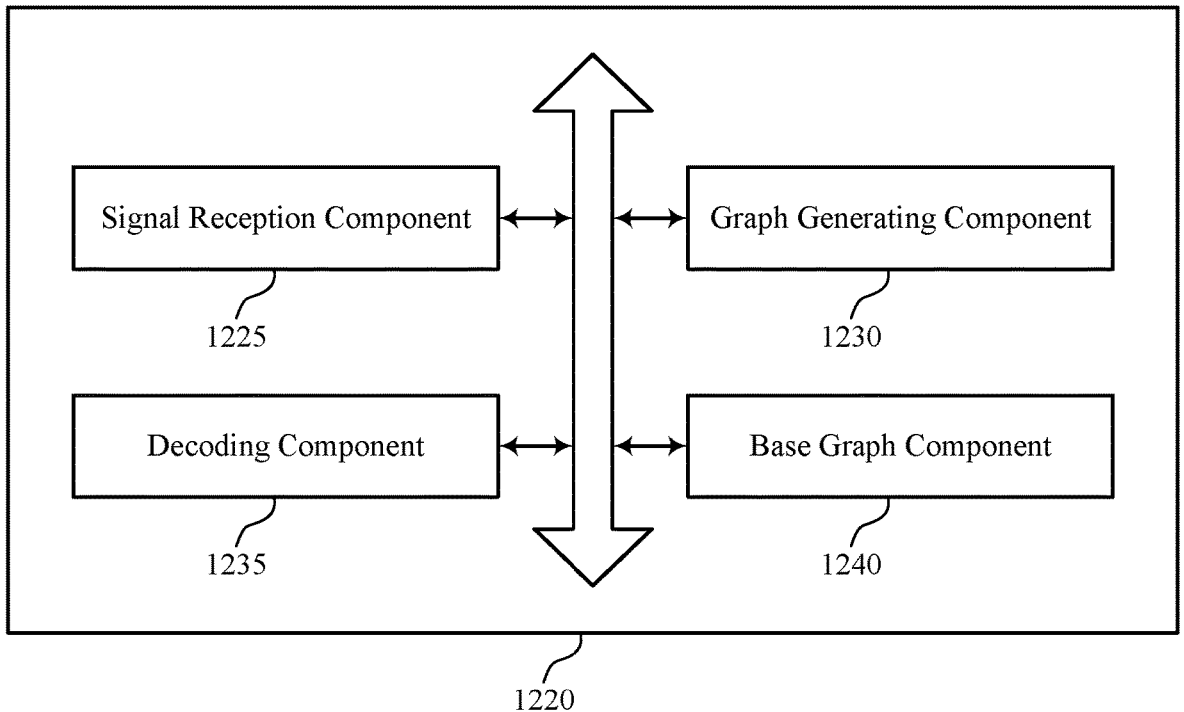
FIG. 12 shows a block diagram of a communications manager that supports fast converging LDPC techniques in accordance with one or more aspects of the present disclosure.

FIG. 12 shows a block diagram 1200 of a communications manager 1220 that supports fast converging LDPC techniques in accordance with one or more aspects of the present disclosure. The communications manager 1220 may be an example of aspects of a communications manager 1020, a communications manager 1120, or both, as described herein. The communications manager 1220, or various components thereof, may be an example of means for performing various aspects of fast converging LDPC techniques as described herein. For example, the communications manager 1220 may include a signal reception component 1225, a graph generating component 1230, a decoding component 1235, a base graph component 1240, or any combination thereof. Each of these components, or components or subcomponents thereof (e.g., one or more processors, one or more memories), may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 1220 may support wireless communications in accordance with examples as disclosed herein. The signal reception component 1225 is capable of, configured to, or operable to support a means for receiving a signal including a set of multiple information bits and a set of multiple parity bits corresponding to an LDPC code. The graph generating component 1230 is capable of, configured to, or operable to support a means for generate the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges. The decoding component 1235 is capable of, configured to, or operable to support a means for decode the set of multiple information bits based on the set of multiple parity bits, a set of multiple information nodes, and a set of multiple parity nodes, the set of multiple information nodes and the set of multiple parity nodes corresponding to the base graph.

In some examples, to support decoding the set of multiple information bits, the decoding component 1235 is capable of, configured to, or operable to support a means for decoding a first set of information bits associated with a first set of information nodes of the set of multiple information nodes based on the first set of information nodes having a single edge and a first degree of edges. In some examples, to support decoding the set of multiple information bits, the decoding component 1235 is capable of, configured to, or operable to support a means for decoding, after the first set of information bits, a second set of information bits associated with a second set of information nodes of the set of multiple information nodes having a single edge and a second degree of edges that is greater than the first degree of edges.

In some examples, to support decoding the set of multiple information bits, the decoding component 1235 is capable of, configured to, or operable to support a means for decoding a first set of information bits associated with a first check node that is connected to the punctured variable node via a single edge. In some examples, to support decoding the set of multiple information bits, the decoding component 1235 is capable of, configured to, or operable to support a means for decoding, after the first set of information bits, a second set of information bits associated with a second check node of the one or more check nodes that are connected to the punctured variable node via the set of multiple edges.

In some examples, the base graph component 1240 is capable of, configured to, or operable to support a means for identifying the base graph based on a quantity of coded bits satisfying a threshold quantity of bits.

In some examples, the decoding component 1235 is capable of, configured to, or operable to support a means for identifying one or more edges are removed from the set of multiple edges based on a quantity of coded bits satisfying a threshold quantity of bits, where decoding the set of multiple information bits is based on the one or more edges being removed from the set of multiple edges.

In some examples, the base graph includes a single punctured node. In some examples, the punctured variable node is the single punctured node.

In some examples, the multiple connected copies of the base graph are connected via edge permutation based on each edge between the set of multiple variable nodes and the set of multiple check nodes being replaced with a respective set of multiple identity matrices with respective circular shift values.

In some examples, a core portion of the base graph includes a higher density of double edges to check nodes than an extension portion of the base graph.

In some examples, the extension portion of the base graph includes a higher density of single edges to check nodes than the core portion of the base graph.

Figure 13:
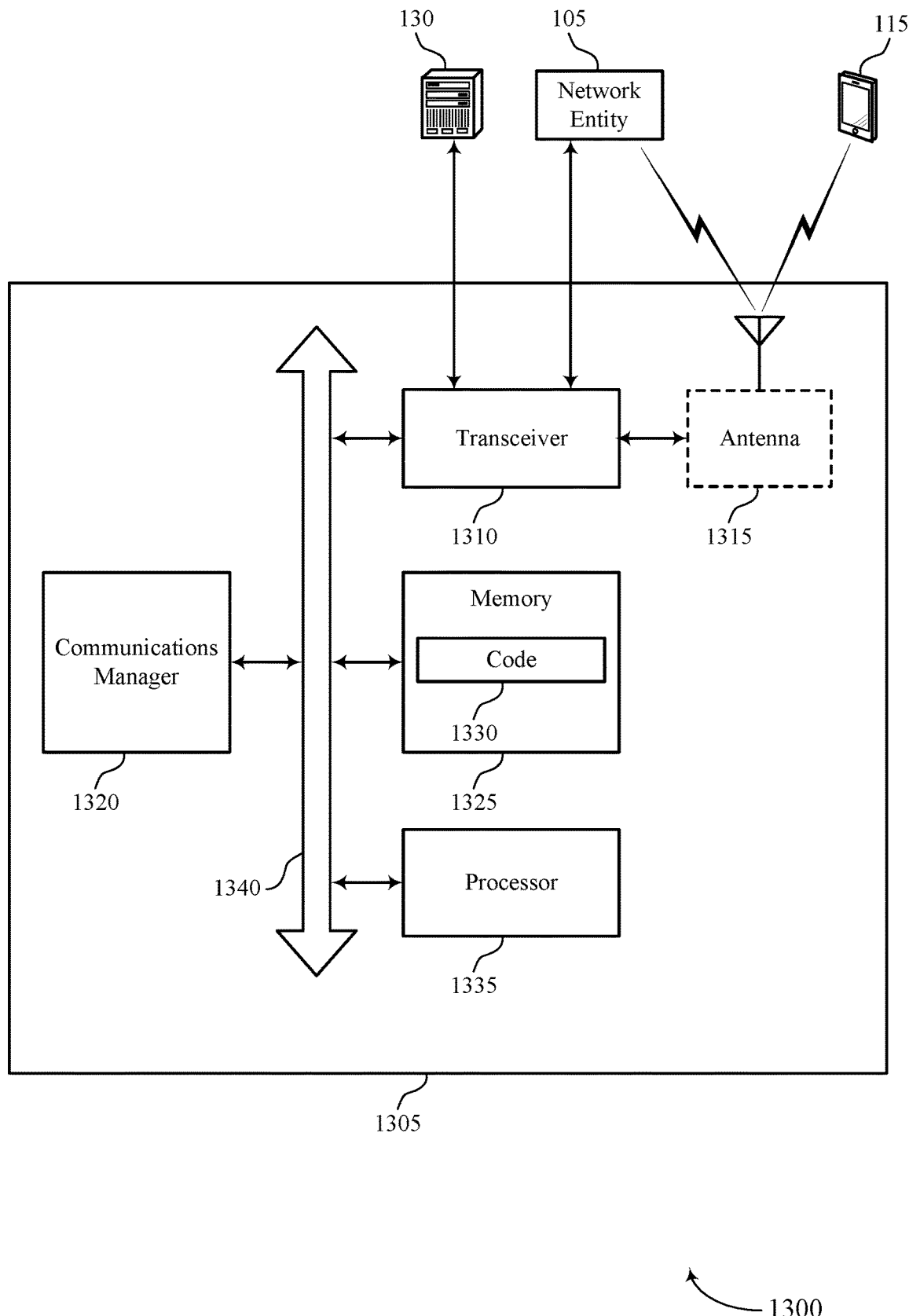
FIG. 13 shows a diagram of a system including a device that supports fast converging LDPC techniques in accordance with one or more aspects of the present disclosure.

FIG. 13 shows a diagram of a system 1300 including a device 1305 that supports fast converging LDPC techniques in accordance with one or more aspects of the present disclosure. The device 1305 may be an example of or include the components of a device 1005, a device 1105, or a network entity 105 as described herein. The device 1305 may communicate with one or more network entities 105, one or more UEs 115, or any combination thereof, which may include communications over one or more wired interfaces, over one or more wireless interfaces, or any combination thereof. The device 1305 may include components that support outputting and obtaining communications, such as a communications manager 1320, a transceiver 1310, an antenna 1315, at least one memory 1325, code 1330, and at least one processor 1335. These components may be in electronic communication or otherwise coupled (e.g., operatively, communicatively, functionally, electronically, electrically) via one or more buses (e.g., a bus 1340).

The transceiver 1310 may support bi-directional communications via wired links, wireless links, or both as described herein. In some examples, the transceiver 1310 may include a wired transceiver and may communicate bi-directionally with another wired transceiver. Additionally, or alternatively, in some examples, the transceiver 1310 may include a wireless transceiver and may communicate bi-directionally with another wireless transceiver. In some examples, the device 1305 may include one or more antennas 1315, which may be capable of transmitting or receiving wireless transmissions (e.g., concurrently). The transceiver 1310 may also include a modem to modulate signals, to provide the modulated signals for transmission (e.g., by one or more antennas 1315, by a wired transmitter), to receive modulated signals (e.g., from one or more antennas 1315, from a wired receiver), and to demodulate signals. In some implementations, the transceiver 1310 may include one or more interfaces, such as one or more interfaces coupled with the one or more antennas 1315 that are configured to support various receiving or obtaining operations, or one or more interfaces coupled with the one or more antennas 1315 that are configured to support various transmitting or outputting operations, or a combination thereof. In some implementations, the transceiver 1310 may include or be configured for coupling with one or more processors or one or more memory components that are operable to perform or support operations based on received or obtained information or signals, or to generate information or other signals for transmission or other outputting, or any combination thereof. In some implementations, the transceiver 1310, or the transceiver 1310 and the one or more antennas 1315, or the transceiver 1310 and the one or more antennas 1315 and one or more processors or one or more memory components (e.g., the at least one processor 1335, the at least one memory 1325, or both), may be included in a chip or chip assembly that is installed in the device 1305. In some examples, the transceiver 1310 may be operable to support communications via one or more communications links (e.g., a communication link 125, a backhaul communication link 120, a midhaul communication link 162, a fronthaul communication link 168).

The at least one memory 1325 may include RAM, ROM, or any combination thereof. The at least one memory 1325 may store computer-readable, computer-executable code 1330 including instructions that, when executed by one or more of the at least one processor 1335, cause the device 1305 to perform various functions described herein. The code 1330 may be stored in a non-transitory computer-readable medium such as system memory or another type of memory. In some cases, the code 1330 may not be directly executable by a processor of the at least one processor 1335 but may cause a computer (e.g., when compiled and executed) to perform functions described herein. In some cases, the at least one memory 1325 may contain, among other things, a BIOS which may control basic hardware or software operation such as the interaction with peripheral components or devices. In some examples, the at least one processor 1335 may include multiple processors and the at least one memory 1325 may include multiple memories. One or more of the multiple processors may be coupled with one or more of the multiple memories which may, individually or collectively, be configured to perform various functions herein (for example, as part of a processing system).

The at least one processor 1335 may include an intelligent hardware device (e.g., a general-purpose processor, a DSP, an ASIC, a CPU, an FPGA, a microcontroller, a programmable logic device, discrete gate or transistor logic, a discrete hardware component, or any combination thereof). In some cases, the at least one processor 1335 may be configured to operate a memory array using a memory controller. In some other cases, a memory controller may be integrated into one or more of the at least one processor 1335. The at least one processor 1335 may be configured to execute computer-readable instructions stored in a memory (e.g., one or more of the at least one memory 1325) to cause the device 1305 to perform various functions (e.g., functions or tasks supporting fast converging LDPC techniques). For example, the device 1305 or a component of the device 1305 may include at least one processor 1335 and at least one memory 1325 coupled with one or more of the at least one processor 1335, the at least one processor 1335 and the at least one memory 1325 configured to perform various functions described herein. The at least one processor 1335 may be an example of a cloud-computing platform (e.g., one or more physical nodes and supporting software such as operating systems, virtual machines, or container instances) that may host the functions (e.g., by executing code 1330) to perform the functions of the device 1305. The at least one processor 1335 may be any one or more suitable processors capable of executing scripts or instructions of one or more software programs stored in the device 1305 (such as within one or more of the at least one memory 1325). In some examples, the at least one processor 1335 may include multiple processors and the at least one memory 1325 may include multiple memories. One or more of the multiple processors may be coupled with one or more of the multiple memories, which may, individually or collectively, be configured to perform various functions herein. In some examples, the at least one processor 1335 may be a component of a processing system, which may refer to a system (such as a series) of machines, circuitry (including, for example, one or both of processor circuitry (which may include the at least one processor 1335) and memory circuitry (which may include the at least one memory 1325)), or components, that receives or obtains inputs and processes the inputs to produce, generate, or obtain a set of outputs. The processing system may be configured to perform one or more of the functions described herein. As such, the at least one processor 1335 or a processing system including the at least one processor 1335 may be configured to, configurable to, or operable to cause the device 1305 to perform one or more of the functions described herein. Further, as described herein, being "configured to," being "configurable to," and being "operable to" may be used interchangeably and may be associated with a capability, when executing code stored in the at least one memory 1325 or otherwise, to perform one or more of the functions described herein.

In some examples, a bus 1340 may support communications of (e.g., within) a protocol layer of a protocol stack. In some examples, a bus 1340 may support communications associated with a logical channel of a protocol stack (e.g., between protocol layers of a protocol stack), which may include communications performed within a component of the device 1305, or between different components of the device 1305 that may be co-located or located in different locations (e.g., where the device 1305 may refer to a system in which one or more of the communications manager 1320, the transceiver 1310, the at least one memory 1325, the code 1330, and the at least one processor 1335 may be located in one of the different components or divided between different components).

In some examples, the communications manager 1320 may manage aspects of communications with a core network 130 (e.g., via one or more wired or wireless backhaul links). For example, the communications manager 1320 may manage the transfer of data communications for client devices, such as one or more UEs 115. In some examples, the communications manager 1320 may manage communications with other network entities 105, and may include a controller or scheduler for controlling communications with UEs 115 in cooperation with other network entities 105. In some examples, the communications manager 1320 may support an X2 interface within an LTE/LTE-A wireless communications network technology to provide communication between network entities 105.

The communications manager 1320 may support wireless communications in accordance with examples as disclosed herein. For example, the communications manager 1320 is capable of, configured to, or operable to support a means for receiving a signal including a set of multiple information bits and a set of multiple parity bits corresponding to an LDPC code. The communications manager 1320 is capable of, configured to, or operable to support a means for generating the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges. The communications manager 1320 is capable of, configured to, or operable to support a means for decoding the set of multiple information bits based on the set of multiple parity bits, a set of multiple information nodes, and a set of multiple parity nodes, the set of multiple information nodes and the set of multiple parity nodes corresponding to the base graph.

By including or configuring the communications manager 1320 in accordance with examples as described herein, the device 1305 may support techniques for faster convergence with asymptotic performance for LDPC codes.

In some examples, the communications manager 1320 may be configured to perform various operations (e.g., receiving, obtaining, monitoring, outputting, transmitting) using or otherwise in cooperation with the transceiver 1310, the one or more antennas 1315 (e.g., where applicable), or any combination thereof. Although the communications manager 1320 is illustrated as a separate component, in some examples, one or more functions described with reference to the communications manager 1320 may be supported by or performed by the transceiver 1310, one or more of the at least one processor 1335, one or more of the at least one memory 1325, the code 1330, or any combination thereof (for example, by a processing system including at least a portion of the at least one processor 1335, the at least one memory 1325, the code 1330, or any combination thereof). For example, the code 1330 may include instructions executable by one or more of the at least one processor 1335 to cause the device 1305 to perform various aspects of fast converging LDPC techniques as described herein, or the at least one processor 1335 and the at least one memory 1325 may be otherwise configured to, individually or collectively, perform or support such operations.

Figure 14:
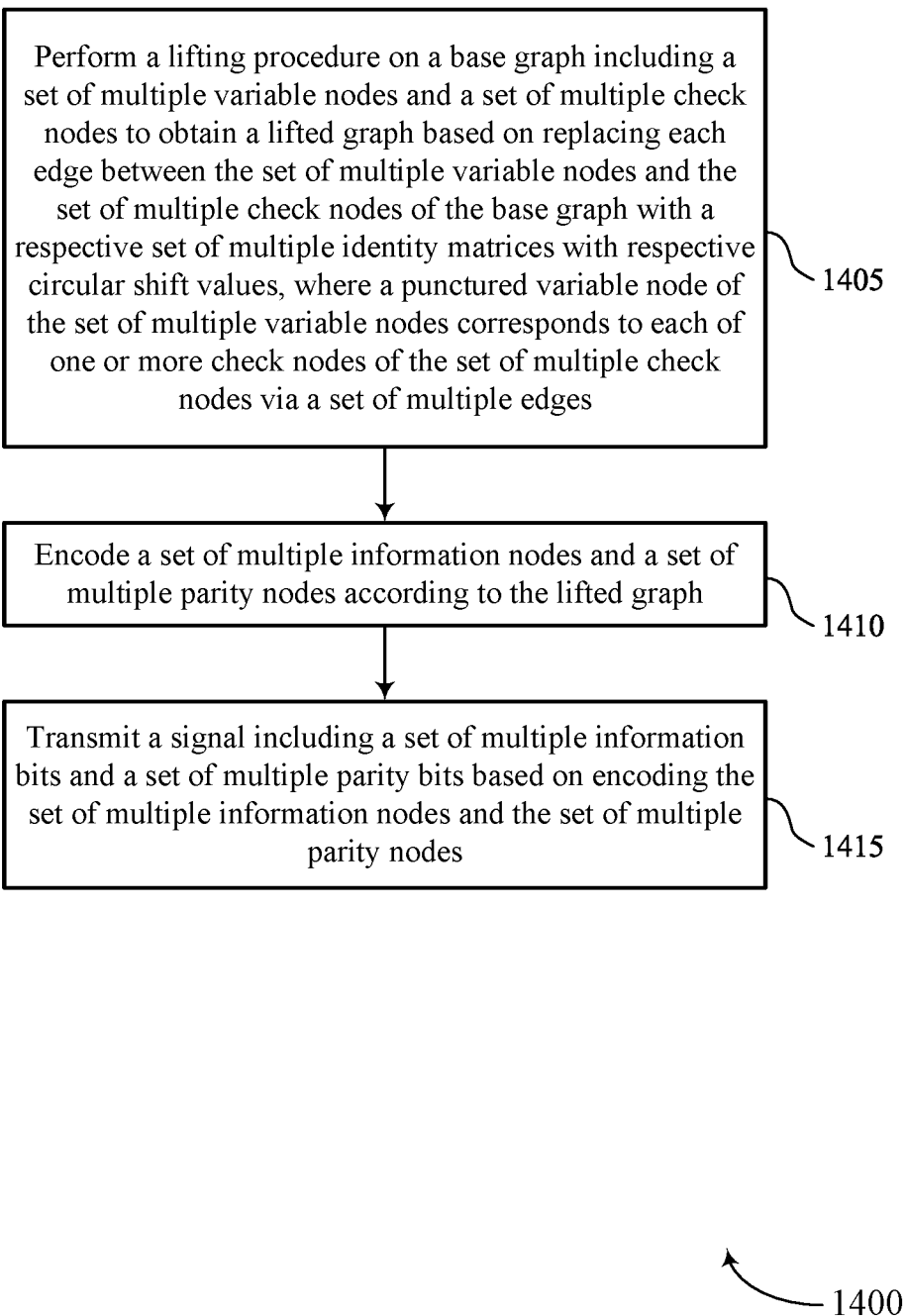
FIGS. 14 and 15 show flowcharts illustrating methods that support fast converging LDPC techniques in accordance with one or more aspects of the present disclosure.

FIG. 14 shows a flowchart illustrating a method 1400 that supports fast converging LDPC techniques in accordance with aspects of the present disclosure. The operations of the method 1400 may be implemented by a UE or its components as described herein. For example, the operations of the method 1400 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1405, the method may include performing a lifting procedure on a base graph including a set of multiple variable nodes and a set of multiple check nodes to obtain a lifted graph based on replacing each edge between the set of multiple variable nodes and the set of multiple check nodes of the base graph with a respective set of multiple identity matrices with respective circular shift values, where a punctured variable node of the set of multiple variable nodes corresponds to each of one or more check nodes of the set of multiple check nodes via a set of multiple edges. The operations of block 1405 may be performed in accordance with examples as disclosed herein. In some examples, aspects of the operations of 1405 may be performed by a lifting component 825 as described with reference to FIG. 8.

At 1410, the method may include encoding a set of multiple information nodes and a set of multiple parity nodes according to the lifted graph. The operations of block 1410 may be performed in accordance with examples as disclosed herein. In some examples, aspects of the operations of 1410 may be performed by an encoding component 830 as described with reference to FIG. 8.

At 1415, the method may include transmitting a signal including a set of multiple information bits and a set of multiple parity bits based on encoding the set of multiple information nodes and the set of multiple parity nodes. The operations of block 1415 may be performed in accordance with examples as disclosed herein. In some examples, aspects of the operations of 1415 may be performed by a signal transmission component 835 as described with reference to FIG. 8.

Figure 15:
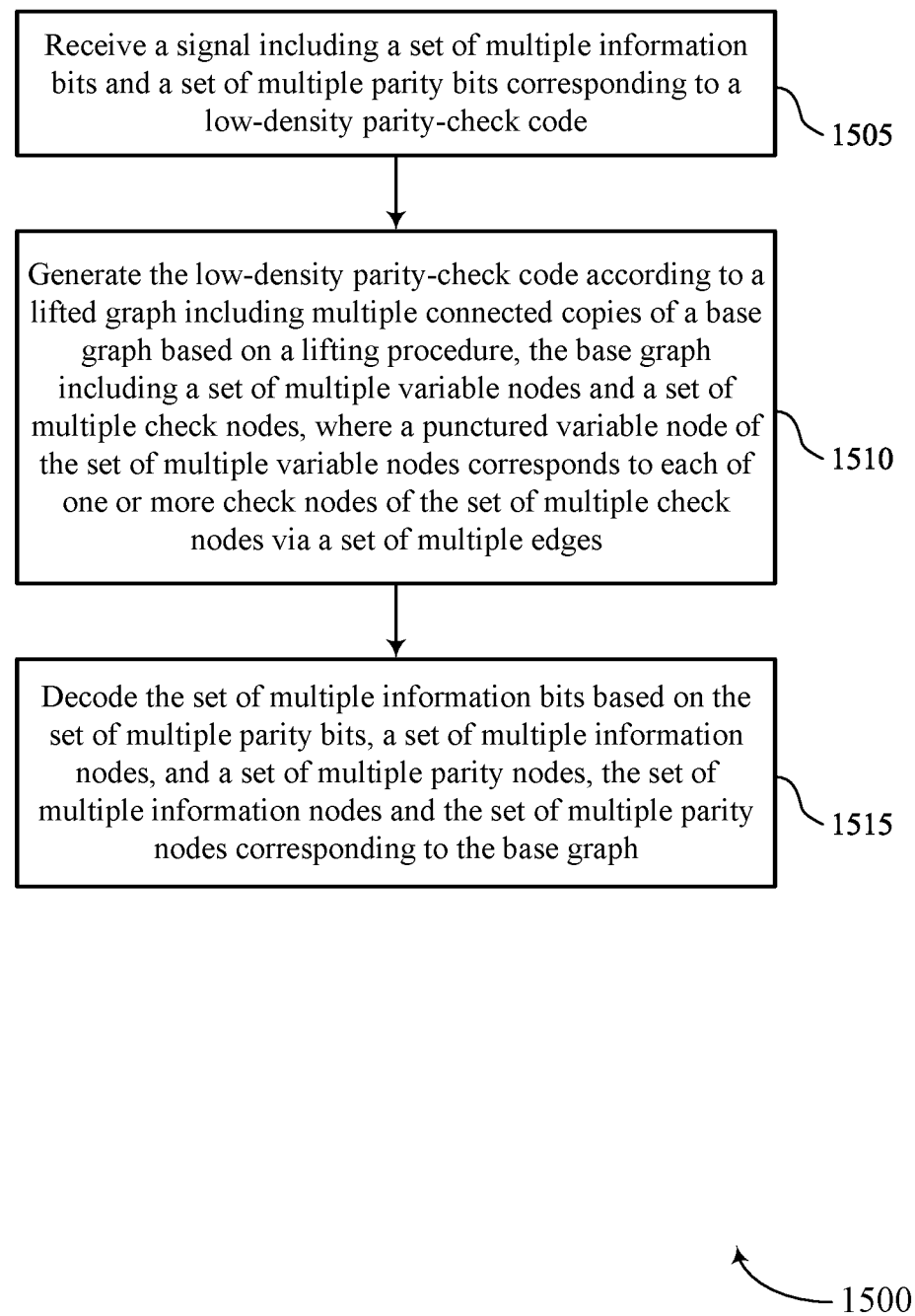

FIG. 15 shows a flowchart illustrating a method 1500 that supports fast converging LDPC techniques in accordance with aspects of the present disclosure. The operations of the method 1500 may be implemented by a network entity or its components as described herein. For example, the operations of the method 1500 may be performed by a network entity as described with reference to FIGS. 1 through 5 and 10 through 13. In some examples, a network entity may execute a set of instructions to control the functional elements of the network entity to perform the described functions. Additionally, or alternatively, the network entity may perform aspects of the described functions using special-purpose hardware.

At 1505, the method may include receiving a signal including a set of multiple information bits and a set of multiple parity bits corresponding to an LDPC code. The operations of block 1505 may be performed in accordance with examples as disclosed herein. In some examples, aspects of the operations of 1505 may be performed by a signal reception component 1225 as described with reference to FIG. 12.

At 1510, the method may include generate the LDPC code according to a lifted graph including multiple connected copies of a base graph based on a lifting procedure, the base graph including a set of multiple variable nodes and a set of multiple check nodes, where a punctured variable node of the set of multiple variable nodes corresponds to each of one or more check nodes of the set of multiple check nodes via a set of multiple edges. The operations of block 1510 may be performed in accordance with examples as disclosed herein. In some examples, aspects of the operations of 1510 may be performed by a graph generating component 1230 as described with reference to FIG. 12.

At 1515, the method may include decode the set of multiple information bits based on the set of multiple parity bits, a set of multiple information nodes, and a set of multiple parity nodes, the set of multiple information nodes and the set of multiple parity nodes corresponding to the base graph. The operations of block 1515 may be performed in accordance with examples as disclosed herein. In some examples, aspects of the operations of 1515 may be performed by a decoding component 1235 as described with reference to FIG. 12.

The following provides an overview of aspects of the present disclosure:

Aspect 1: A method for wireless communications at a transmitting device, comprising: performing a lifting procedure on a base graph comprising a plurality of variable nodes and a plurality of check nodes to obtain a lifted graph based at least in part on replacing each edge between the plurality of variable nodes and the plurality of check nodes of the base graph with a respective plurality of identity matrices with respective circular shift values, wherein a punctured variable node of the plurality of variable nodes corresponds to each of one or more check nodes of the plurality of check nodes via a plurality of edges; encoding a plurality of information nodes and a plurality of parity nodes according to the lifted graph; and transmitting a signal comprising a plurality of information bits and a plurality of parity bits based at least in part on encoding the plurality of information nodes and the plurality of parity nodes.

Aspect 2: The method of aspect 1, further comprising: selecting a size for the lifted graph based at least in part on a quantity of coded bits satisfying a threshold quantity of bits.

Aspect 3: The method of any of aspects 1 through 2, further comprising: removing one or more edges from the plurality of edges based at least in part on a quantity of coded bits satisfying a threshold quantity of bits, wherein replacing each edge between the plurality of variable nodes and the plurality of check nodes is based at least in part on removing the one or more edges from the plurality of edges.

Aspect 4: The method of any of aspects 1 through 3, wherein the base graph comprises a single punctured node, and the punctured variable node is the single punctured node.

Aspect 5: The method of any of aspects 1 through 4, wherein encoding the plurality of information nodes and the plurality of parity nodes comprises: replacing the plurality of edges between the punctured variable node and the one or more check nodes with a summation of a respective plurality of identity matrices with respective circular shift values.

Aspect 6: The method of any of aspects 1 through 5, wherein a size of the lifted graph is based at least in part on a codeblock length and a length of the base graph.

Aspect 7: The method of any of aspects 1 through 6, wherein performing the lifting procedure comprises: generating multiple copies of the base graph that are connected via edge permutation based at least in part on replacing each edge between the plurality of variable nodes and the plurality of check nodes with the respective plurality of identity matrices with the respective circular shift values.

Aspect 8: The method of any of aspects 1 through 7, wherein performing the lifting procedure comprises: determining, from a table, the respective circular shift values of the respective plurality of identity matrices for each edge of the base graph.

Aspect 9: The method of aspect 8, wherein the table includes a plurality of circular shift values for each identity matrix applied to the plurality of edges associated with the punctured variable node.

Aspect 10: The method of any of aspects 8 through 9, wherein the table includes a singular value indicative of a plurality of circular shift values for each identity matrix applied to the plurality of edges associated with the punctured variable node based at least in part on a size of the lifted graph.

Aspect 11: The method of any of aspects 1 through 10, wherein encoding the plurality of information nodes and the plurality of parity nodes comprises: encoding the plurality of information nodes and the plurality of parity nodes in accordance with a second degree encoding chain and a first degree HARQ extension.

Aspect 12: The method of any of aspects 1 through 11, wherein a core portion of the base graph comprises a higher density of double edges to check nodes than an extension portion of the base graph.

Aspect 13: The method of aspect 12, wherein the extension portion of the base graph comprises a higher density of single edges to check nodes than the core portion of the base graph.

Aspect 14: A method for wireless communications at a receiving device, comprising: receiving a signal comprising a plurality of information bits and a plurality of parity bits corresponding to a low-density parity-check code; generate the low-density parity-check code according to a lifted graph comprising multiple connected copies of a base graph based at least in part on a lifting procedure, the base graph comprising a plurality of variable nodes and a plurality of check nodes, wherein a punctured variable node of the plurality of variable nodes corresponds to each of one or more check nodes of the plurality of check nodes via a plurality of edges; and decode the plurality of information bits based at least in part on the plurality of parity bits, a plurality of information nodes, and a plurality of parity nodes, the plurality of information nodes and the plurality of parity nodes corresponding to the base graph.

Aspect 15: The method of aspect 14, wherein decoding the plurality of information bits comprises: decoding a first set of information bits associated with a first set of information nodes of the plurality of information nodes based at least in part on the first set of information nodes having a single edge and a first degree of edges; and decoding, after the first set of information bits, a second set of information bits associated with a second set of information nodes of the plurality of information nodes having a single edge and a second degree of edges that is greater than the first degree of edges.

Aspect 16: The method of any of aspects 14 through 15, wherein decoding the plurality of information bits comprises: decoding a first set of information bits associated with a first check node that is connected to the punctured variable node via a single edge; and decoding, after the first set of information bits, a second set of information bits associated with a second check node of the one or more check nodes that are connected to the punctured variable node via the plurality of edges.

Aspect 17: The method of any of aspects 14 through 16, further comprising: identifying the base graph based at least in part on a quantity of coded bits satisfying a threshold quantity of bits.

Aspect 18: The method of any of aspects 14 through 17, further comprising: identifying one or more edges are removed from the plurality of edges based at least in part on a quantity of coded bits satisfying a threshold quantity of bits, wherein decoding the plurality of information bits is based at least in part on the one or more edges being removed from the plurality of edges.

Aspect 19: The method of any of aspects 14 through 18, wherein the base graph comprises a single punctured node, and the punctured variable node is the single punctured node.

Aspect 20: The method of any of aspects 14 through 19, wherein the multiple connected copies of the base graph are connected via edge permutation based at least in part on each edge between the plurality of variable nodes and the plurality of check nodes being replaced with a respective plurality of identity matrices with respective circular shift values.

Aspect 21: The method of any of aspects 14 through 20, wherein a core portion of the base graph comprises a higher density of double edges to check nodes than an extension portion of the base graph.

Aspect 22: The method of aspect 21, wherein the extension portion of the base graph comprises a higher density of single edges to check nodes than the core portion of the base graph.

Aspect 23: A transmitting device for wireless communications, comprising one or more memories storing processor-executable code, and one or more processors coupled with the one or more memories and individually or collectively operable to execute the code to cause the transmitting device to perform a method of any of aspects 1 through 13.

Aspect 24: A transmitting device for wireless communications, comprising at least one means for performing a method of any of aspects 1 through 13.

Aspect 25: A non-transitory computer-readable medium storing code for wireless communications, the code comprising instructions executable by a processor to perform a method of any of aspects 1 through 13.

Aspect 26: A receiving device for wireless communications, comprising one or more memories storing processor-executable code, and one or more processors coupled with the one or more memories and individually or collectively operable to execute the code to cause the receiving device to perform a method of any of aspects 14 through 22.

Aspect 27: A receiving device for wireless communications, comprising at least one means for performing a method of any of aspects 14 through 22.

Aspect 28: A non-transitory computer-readable medium storing code for wireless communications, the code comprising instructions executable by a processor to perform a method of any of aspects 14 through 22.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Any functions or operations described herein as being capable of being performed by a processor may be performed by multiple processors that, individually or collectively, are capable of performing the described functions or operations.

The functions described herein may be implemented using hardware, software executed by a processor, firmware, or any combination thereof. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc. Disks may reproduce data magnetically, and discs may reproduce data optically using lasers. Combinations of the above are also included within the scope of computer-readable media. Any functions or operations described herein as being capable of being performed by a memory may be performed by multiple memories that, individually or collectively, are capable of performing the described functions or operations.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (e.g., receiving information), accessing (e.g., accessing data stored in memory)

and the like. Also, "determining" can include resolving, obtaining, selecting, choosing, establishing, and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A transmitting device, comprising:
one or more memories storing processor-executable code; and
one or more processors coupled with the one or more memories and individually or collectively operable to execute the code to cause the transmitting device to:
perform a lifting procedure on a base graph comprising a plurality of variable nodes and a plurality of check nodes to obtain a lifted graph based at least in part on replacing each edge between the plurality of variable nodes and the plurality of check nodes of the base graph with a respective plurality of identity matrices with respective circular shift values, wherein a punctured variable node of the plurality of variable nodes corresponds to each of one or more check nodes of the plurality of check nodes via a plurality of edges;
encode a plurality of information nodes and a plurality of parity nodes according to the lifted graph; and
transmit a signal comprising a plurality of information bits and a plurality of parity bits based at least in part on encoding the plurality of information nodes and the plurality of parity nodes.

2. The transmitting device of claim 1, wherein the one or more processors are individually or collectively further operable to execute the code to cause the transmitting device to:
select a size for the lifted graph based at least in part on a quantity of coded bits satisfying a threshold quantity of bits.

3. The transmitting device of claim 1, wherein the one or more processors are individually or collectively further operable to execute the code to cause the transmitting device to:
remove one or more edges from the plurality of edges based at least in part on a quantity of coded bits satisfying a threshold quantity of bits, wherein replacing each edge between the plurality of variable nodes and the plurality of check nodes is based at least in part on removing the one or more edges from the plurality of edges.

4. The transmitting device of claim 1, wherein the base graph comprises a single punctured node, and the punctured variable node is the single punctured node.

5. The transmitting device of claim 1, wherein, to encode the plurality of information nodes and the plurality of parity nodes, the one or more processors are individually or collectively operable to execute the code to cause the transmitting device to:
replace the plurality of edges between the punctured variable node and the one or more check nodes with a summation of a respective plurality of identity matrices with respective circular shift values.

6. The transmitting device of claim 1, wherein a size of the lifted graph is based at least in part on a codeblock length and a length of the base graph.

7. The transmitting device of claim 1, wherein, to perform the lifting procedure, the one or more processors are individually or collectively operable to execute the code to cause the transmitting device to:
generate multiple copies of the base graph that are connected via edge permutation based at least in part on replacing each edge between the plurality of variable nodes and the plurality of check nodes with the respective plurality of identity matrices with respective circular shift values.

8. The transmitting device of claim 1, wherein, to perform the lifting procedure, the one or more processors are individually or collectively operable to execute the code to cause the transmitting device to:
determine, from a table, the respective circular shift values of the respective plurality of identity matrices for each edge of the base graph.

9. The transmitting device of claim 8, wherein the table includes a plurality of circular shift values for each identity matrix applied to the plurality of edges associated with the punctured variable node.

10. The transmitting device of claim 8, wherein the table includes a singular value indicative of a plurality of circular shift values for each identity matrix applied to the plurality of edges associated with the punctured variable node based at least in part on a size of the lifted graph.

11. The transmitting device of claim 1, wherein, to encode the plurality of information nodes and the plurality of parity nodes, the one or more processors are individually or collectively operable to execute the code to cause the transmitting device to:
encode the plurality of information nodes and the plurality of parity nodes in accordance with a second degree encoding chain and a first degree hybrid automatic repeat request (HARQ) extension.

12. The transmitting device of claim 1, wherein a core portion of the base graph comprises a higher density of double edges to check nodes than an extension portion of the base graph.

13. The transmitting device of claim 12, wherein the extension portion of the base graph comprises a higher density of single edges to check nodes than the core portion of the base graph.

14. A receiving device, comprising:
one or more memories storing processor-executable code; and
one or more processors coupled with the one or more memories and individually or collectively operable to execute the code to cause the receiving device to:
receive a signal comprising a plurality of information bits and a plurality of parity bits corresponding to a low-density parity-check code;
generate the low-density parity-check code according to a lifted graph comprising multiple connected copies of a base graph based at least in part on a lifting procedure, the base graph comprising a plurality of variable nodes and a plurality of check nodes, wherein a punctured variable node of the plurality of variable nodes corresponds to each of one or more check nodes of the plurality of check nodes via a plurality of edges; and
decode the plurality of information bits based at least in part on the plurality of parity bits, a plurality of information nodes, and a plurality of parity nodes, the plurality of information nodes and the plurality of parity nodes corresponding to the base graph.

15. The receiving device of claim 14, wherein, to decode the plurality of information bits, the one or more processors are individually or collectively operable to execute the code to cause the receiving device to:
decode a first set of information bits associated with a first set of information nodes of the plurality of information nodes based at least in part on the first set of information nodes having a single edge and a first degree of edges; and
decode, after the first set of information bits, a second set of information bits associated with a second set of information nodes of the plurality of information nodes having a single edge and a second degree of edges that is greater than the first degree of edges.

16. The receiving device of claim 14, wherein, to decode the plurality of information bits, the one or more processors are individually or collectively operable to execute the code to cause the receiving device to:
decode a first set of information bits associated with a first check node that is connected to the punctured variable node via a single edge; and
decode, after the first set of information bits, a second set of information bits associated with a second check node of the one or more check nodes that are connected to the punctured variable node via the plurality of edges.

17. The receiving device of claim 14, wherein the one or more processors are individually or collectively further operable to execute the code to cause the receiving device to:
identify the base graph based at least in part on a quantity of coded bits satisfying a threshold quantity of bits.

18. The receiving device of claim 14, wherein the one or more processors are individually or collectively further operable to execute the code to cause the receiving device to:
identify one or more edges are removed from the plurality of edges based at least in part on a quantity of coded bits satisfying a threshold quantity of bits, wherein decoding the plurality of information bits is based at least in part on the one or more edges being removed from the plurality of edges.

19. The receiving device of claim 14, wherein the base graph comprises a single punctured node, and the punctured variable node is the single punctured node.

20. The receiving device of claim 14, wherein the multiple connected copies of the base graph are connected via edge permutation based at least in part on each edge between the plurality of variable nodes and the plurality of check nodes being replaced with a respective plurality of identity matrices with respective circular shift values.

21. The receiving device of claim 14, wherein a core portion of the base graph comprises a higher density of double edges to check nodes than an extension portion of the base graph.

22. The receiving device of claim 21, wherein the extension portion of the base graph comprises a higher density of single edges to check nodes than the core portion of the base graph.

23. A method for wireless communications at a transmitting device, comprising:
performing a lifting procedure on a base graph comprising a plurality of variable nodes and a plurality of check nodes to obtain a lifted graph based at least in part on replacing each edge between the plurality of variable nodes and the plurality of check nodes of the base graph with a respective plurality of identity matrices with respective circular shift values, wherein a punctured variable node of the plurality of variable nodes corresponds to each of one or more check nodes of the plurality of check nodes via a plurality of edges;
encoding a plurality of information nodes and a plurality of parity nodes according to the lifted graph; and
transmitting a signal comprising a plurality of information bits and a plurality of parity bits based at least in part on encoding the plurality of information nodes and the plurality of parity nodes.

24. The method of claim 23, further comprising:
selecting a size for the lifted graph based at least in part on a quantity of coded bits satisfying a threshold quantity of bits.

25. The method of claim 23, further comprising:
removing one or more edges from the plurality of edges based at least in part on a quantity of coded bits satisfying a threshold quantity of bits, wherein replacing each edge between the plurality of variable nodes and the plurality of check nodes is based at least in part on removing the one or more edges from the plurality of edges.

26. The method of claim 23, wherein the base graph comprises a single punctured node, and the punctured variable node is the single punctured node.

27. The method of claim 23, wherein encoding the plurality of information nodes and the plurality of parity nodes comprises:
replacing the plurality of edges between the punctured variable node and the one or more check nodes with a summation of a respective plurality of identity matrices with respective circular shift values.

28. The method of claim 23, wherein a size of the lifted graph is based at least in part on a codeblock length and a length of the base graph.

29. The method of claim 23, wherein performing the lifting procedure comprises:
generating a multiple copies of the base graph that are connected via edge permutation based at least in part on replacing each edge between the plurality of variable nodes and the plurality of check nodes with the respective plurality of identity matrices.

30. A method for wireless communications at a receiving device, comprising:
- receiving a signal comprising a plurality of information bits and a plurality of parity bits corresponding to a low-density parity-check code;
- generate the low-density parity-check code according to a lifted graph comprising multiple connected copies of a base graph based at least in part on a lifting procedure, the base graph comprising a plurality of variable nodes and a plurality of check nodes, wherein a punctured variable node of the plurality of variable nodes corresponds to each of one or more check nodes of the plurality of check nodes via a plurality of edges; and
- decode the plurality of information bits based at least in part on the plurality of parity bits, a plurality of information nodes, and a plurality of parity nodes, the plurality of information nodes and the plurality of parity nodes corresponding to the base graph.

\* \* \* \* \*